(12) United States Patent
Maruyama et al.

(10) Patent No.: US 12,531,545 B2
(45) Date of Patent: Jan. 20, 2026

(54) FILTER CIRCUIT

(71) Applicant: Mitsubishi Electric Corporation, Tokyo (JP)

(72) Inventors: Takaya Maruyama, Tokyo (JP); Sho Ikeda, Tokyo (JP); Koji Tsutsumi, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 11 days.

(21) Appl. No.: 18/614,831

(22) Filed: Mar. 25, 2024

(65) Prior Publication Data

US 2024/0235529 A1 Jul. 11, 2024

Related U.S. Application Data

(63) Continuation of application No. PCT/JP2021/044061, filed on Dec. 1, 2021.

(51) Int. Cl.
*H03H 11/04* (2006.01)
(52) U.S. Cl.
CPC .................................. *H03H 11/04* (2013.01)
(58) Field of Classification Search
CPC ....................................................... H03H 11/04
See application file for complete search history.

(56) References Cited

U.S. PATENT DOCUMENTS

2010/0019582 A1* 1/2010 Okanobu ............. H03K 17/687
307/109
2016/0380593 A1* 12/2016 Lu ....................... H03H 11/0405
327/361

FOREIGN PATENT DOCUMENTS

| JP | 60-160724 A | 8/1985 | |
| JP | 61-72933 U | 5/1986 | |
| WO | WO-2018032453 A1 * | 2/2018 | ................ H01P 1/20 |

OTHER PUBLICATIONS

Ghaffari et al., "Tunable High-Q N-Path Band-Pass Filters: Modeling and Verification", IEEE Journal of Solid-State Circuits, vol. 46, No. 5, May 2011, pp. 998-1010.
International Search Report (PCT/ISA/210) issued in PCT/JP2021/044061, mailed on Feb. 8, 2022.

* cited by examiner

*Primary Examiner* — Daniel C Puentes
(74) *Attorney, Agent, or Firm* — BIRCH, STEWART, KOLASCH & BIRCH, LLP

(57) ABSTRACT

A filter circuit includes: a filter unit which is connected to a signal line and which has transistors and capacitors which constitute paths for N phases, and in which the transistors to which clock signals of N phases are applied electrically connect the capacitors to the signal line; and a dummy unit which has transistors and impedance parts which constitute dummy paths corresponding, respectively, to the paths for the N phases, and in which the transistors to which inverted signals of N phases are applied electrically connect the impedance parts to the signal line.

7 Claims, 15 Drawing Sheets

FILTER CIRCUIT

CROSS-REFERENCE TO RELATED APPLICATION

This application is a Continuation of PCT International Application No. PCT/JP2021/044061, filed on Dec. 1, 2021, which is hereby expressly incorporated by reference into the present application.

TECHNICAL FIELD

The present disclosure relates to a filter circuit having multiple paths.

BACKGROUND ART

A filter circuit for filtering only a desired wave is used for wireless transmitters and receivers. As the filter circuit, there is an N-path (N is integer greater than or equal to 2) filter, for example. An N-path filter is a filter circuit which includes N transistors each of which is connected to a common radio frequency (RF) signal line, and which switches among the N transistors using clock signals of N phases, so that the center frequency of a used frequency band is made to be equal to the clock frequency. Therefore, the N-path filter can be made to perform an operation in a wide band by changing the clock frequency.

In the N-path filter, the clock signal of a high frequency may leak out to the RF signal line via a parasitic capacitance formed between the transistors and the RF signal line. In this case, spurious components caused by the clock signal leaking out to the RF signal line degrades the quality of signals. As a conventional N-path filter configured to solve this malfunction, there is an N-path filter described in Nonpatent Literature 1, for example. In the N-path filter described in Nonpatent Literature 1, an RF signal line is configured, as differential signal lines for a positive phase and a negative phase, using a balun, and clock signals leaking out to these differential signal lines are canceled out.

CITATION LIST

Nonpatent Literature

Nonpatent Literature 1: A. Ghaffari et al., "Tunable High-Q N-Path Band-Pass Filters: Modeling and Verification," IEEE J. Solid-State Circuits, vol. 46, no. 5, pp. 998-1010, 2011.

SUMMARY OF INVENTION

Technical Problem

A balun included in the N-path filter described in Nonpatent Literature 1 is an element which is generally difficult to implement in a wide band. Therefore, a problem with the N-path filter described in Nonpatent Literature 1 is that its used frequency band is limited to a frequency band which can be allowed in baluns, and the N-path filter cannot perform an operation in a wide band.

The present disclosure is made to solve the above-mentioned problem, and it is therefore an object of the present disclosure to provide a filter circuit that can perform an operation in a wide band and suppress spurious components.

Solution To Problem

A filter circuit according to the present disclosure includes: a filter circuit which is connected to a signal line having a blocking capacitance for blocking a DC component and which has multiple transistors and multiple capacitors which constitute paths for multiple phases, and in which the transistors to which clock signals of multiple phases are applied electrically connect the capacitors to the signal line; and a dummy circuit which has multiple transistors and multiple impedance parts which constitute multiple dummy paths corresponding, respectively, to the paths for the multiple phases, and in which the transistors to which inverted signals of multiple phases generated by inverting the clock signals are applied electrically connect the impedance parts to the signal line.

Advantageous Effects Of Invention

According to the present disclosure, the clock signals of multiple phases are applied, respectively, to the multiple transistors included in the filter circuit, and the inverted signals of multiple phases are applied, respectively, to the multiple transistors included in the dummy circuit. As a result, because the clock signals leaking out from the filter circuit and the inverted signals leaking out from the dummy circuit cancel each other out, the filter circuit according to the present disclosure can suppress spurious components even though the filter circuit does not use differential signal lines, and can perform a wideband operation because the filter circuit does not need a balun.

DESCRIPTION OF EMBODIMENTS

Embodiment 1

Figure 1:
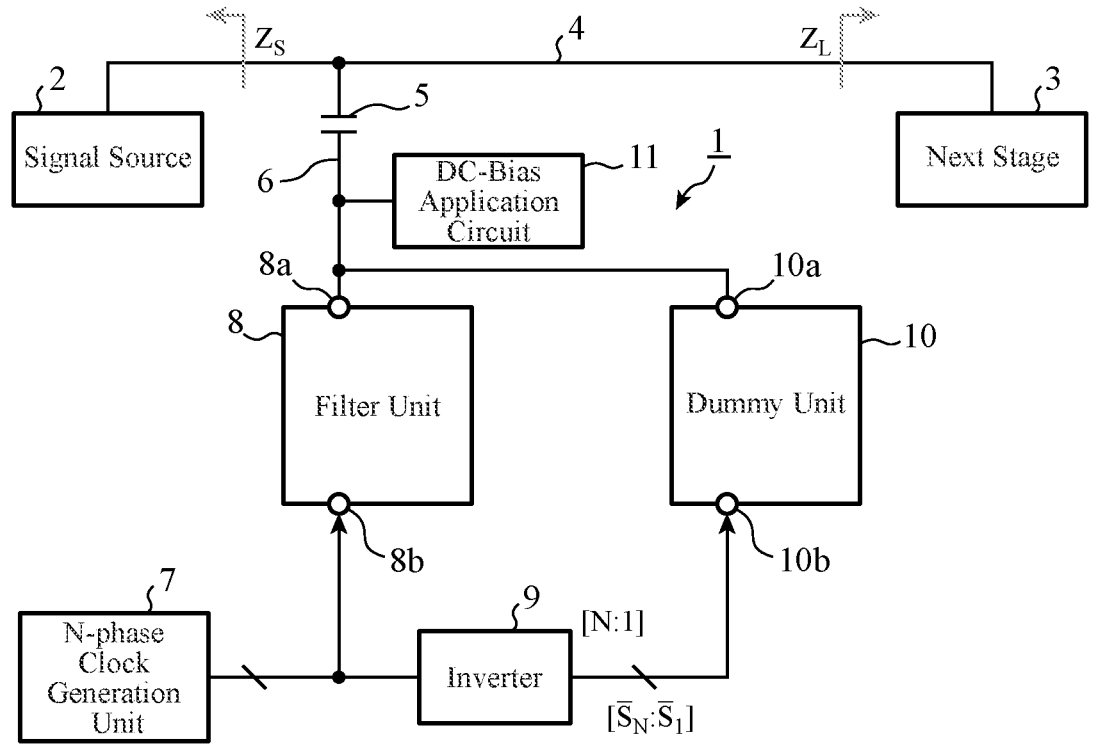
FIG. 1 is a block diagram showing a filter circuit 1 according to Embodiment 1.

FIG. 1 is a block diagram showing a filter circuit 1 according to Embodiment 1. In FIG. 1, the filter circuit 1 is an N-path filter having N parallel paths which are multiple phases, and removes a part within a band from an RF signal from a signal source 2 and outputs the RF signal after removal to a next stage element 3. A connection between the signal source 2 and the next stage element 3 is made by a signal line 4. N is a natural number greater than or equal to 2. Further, a blocking capacitor 5 is a blocking capacitance for blocking a DC component, and is disposed between the signal line 4 and a signal line 6. The signal line 6 is one to which the blocking capacitor 5 is connected in series, and has a blocking capacitance. The signal line 6 is connected, via the blocking capacitor 5, to the signal source 2. The filter circuit 1 includes the signal line 6, an N-phase clock generation unit 7, a filter unit 8, an inverter 9, a dummy unit 10, and a DC bias application circuit 11.

The signal source 2 generates an RF signal which is to be supplied, via the signal lines 4 and 6, to the filter circuit 1 and the next stage element 3. In FIG. 1, impedance $Z_s$ is one seen from an output side of the signal source 2. The next stage element 3 is disposed as a next stage following the signal source 2, and receives the RF signal generated by the signal source 2. Impedance $Z_L$ is one seen from an input side of the next stage element 3. The blocking capacitor 5 is connected in series to the signal line 6, and blocks a DC component occurring in the filter circuit 1, to isolate the DC component from the signal source 2 and the next stage element 3. For example, the blocking capacitor 5 blocks a DC voltage occurring inside a wireless transmission and reception circuit including the filter circuit 1, and allows an AC component to pass therethrough.

The N-phase clock generation unit 7 generates clock signals $S_1$ to $S_N$ of N phases. The clock signals of N phases generated by the N-phase clock generation unit 7 are supplied, via an N-phase clock terminal 8b, to the filter unit 8, and are further supplied to the inverter 9. The inverter 9 inverts the polarities of the clock signals of N phases, to generate inverted signals of N phases. The inverted signals of N phases generated by the inverter 9 are supplied, via an inverted signal terminal 10b, to the dummy unit 10.

The filter unit 8 is a single-port N-path filter having an RF signal terminal 8a via which the RF signal is inputted, and the N-phase clock terminal 8b via which the clock signals of N phases are inputted. The filter unit 8 includes N transistors which constitute first phase to N-th phase paths, and the transistors are connected to the signal line 6 and a grounded capacitor. The capacitor has a baseband capacitance which determines the filter characteristics. Further, the capacitance of the capacitor may be variable.

When the clock signals of N phases are applied to the N transistors included in the filter unit 8, one of the N transistors electrically connects the capacitor to the signal line 6.

More specifically, each of the paths is a switched capacitor which switches between an electrical connection and an electrical disconnection between a capacitor and the signal line 6. With these components, the filter unit 8 functions as a bandpass filter in which the frequency of each of the clock signals of N phases is the center frequency of a passband. Further, by changing the frequency of the clock signals of N phases, the center frequency of the passband of the filter unit 8 can be changed.

The dummy unit 10 is a circuit which has an RF signal terminal 10a via which the RF signal is inputted, and the inverted signal terminal 10b via which the inverted signals of N phases are inputted, and which is configured by following a single-port N-path filter. The dummy unit 10 has first phase to N-th phase dummy paths which correspond to the first phase to N-th phase paths in the filter unit 8, and each of the dummy paths includes N transistors. In each of the N transistors, the signal line 6 is connected to a grounded impedance part.

The impedance part has impedance which is sufficiently high compared with that of the signal source 2 and that of the next stage element 3. By supplying the inverted signals of N phases to the N transistors included in the dummy unit 10, N−1 transistors, out of the N transistors, electrically connect impedance parts to the signal line 6.

More specifically, each of the dummy paths is switched impedance which switches between an electrical connection and an electrical disconnection between an impedance part and the signal line 6.

The DC bias application circuit 11 determines a DC bias voltage (DC bias) in the signal line 6. Here, the DC bias is a DC voltage for driving the multiple transistors which each of the following units: the filter unit 8 and the dummy unit 10 includes. The DC bias application circuit 11 is a shunt resistor, for example.

Next, the basic operation of the filter circuit 1 which is an N-path filter will be explained, and a malfunction caused by a leakage current of the clock signals of N phases will be explained.

Figure 2:
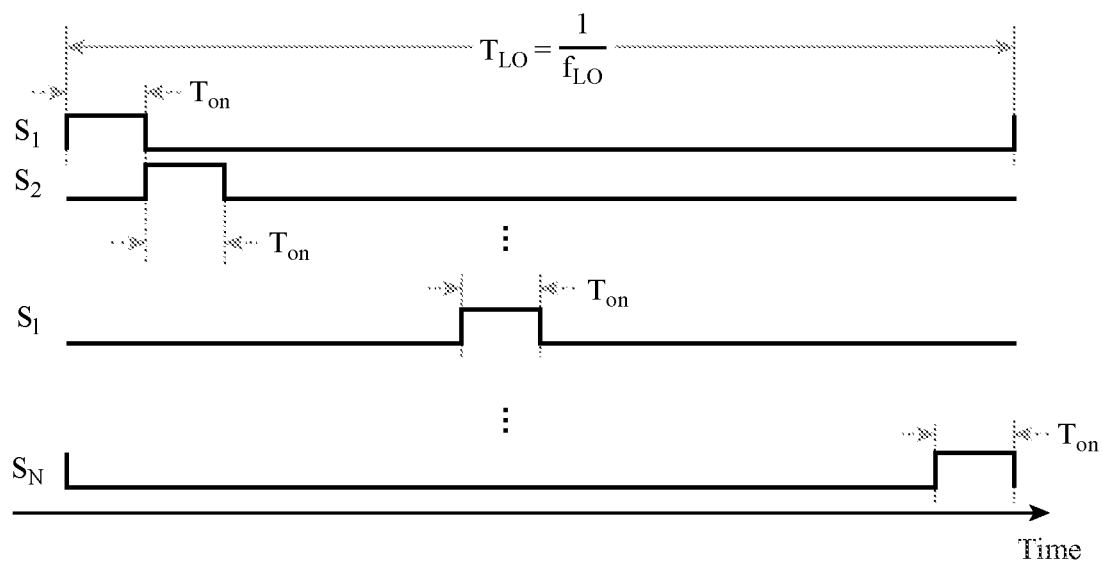
FIG. 2 is a waveform diagram showing clock signals of N phases.

FIG. 2 is a waveform diagram showing the clock signals $S_1$ to $S_N$ of N phases. In FIG. 2, the on-time duration $T_{on}$ is the length of time during which each of the clock signals of N phases has an on level. The period $T_{LO}$ of each of the clock signals of N phases is the reciprocal of the frequency $f_{LO}$ of each of the clock signals of N phases. In the clock signals of N phases in an ideal state, the on-time duration $T_{on}$ of the clock signal of each of the first to N-th phases is equal, and the clock signals are out of phase from one another in such a way that the clock signals do not overlap one another with respect to time. The clock signals $S_1$ to $S_N$ of N phases are supplied to the first phase to N-th phase paths in the filter unit 8 during each period $T_{LO}$.

Figure 3:
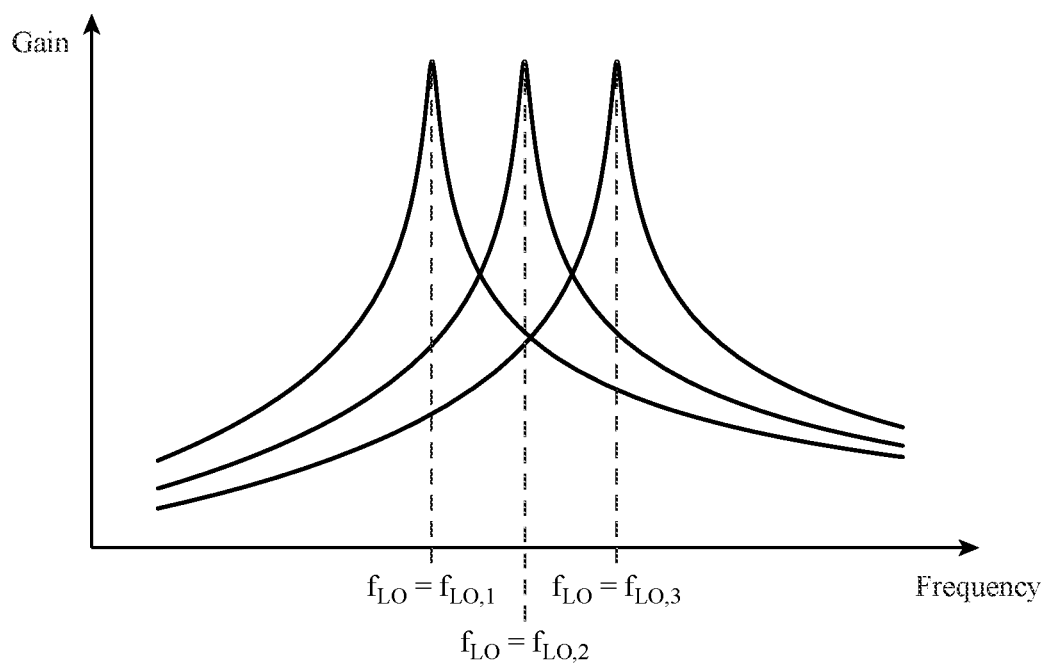
FIG. 3 is a diagram showing the transfer characteristic of the filter circuit according to Embodiment 1.

FIG. 3 is a view showing the transfer characteristics of the filter circuit 1, and shows the gain for the frequency. When the power spectrum of the RF signal which the signal source 2 supplies to the signal line 6 is denoted by $P_{in}(f)$, and the power spectrum of the RF signal which is outputted from the signal line 6 to the next stage element 3 is denoted by $P_{out}(f)$, the gain shown in FIG. 3 is $P_{out}(f)/P_{in}(f)$.

Figure 4:
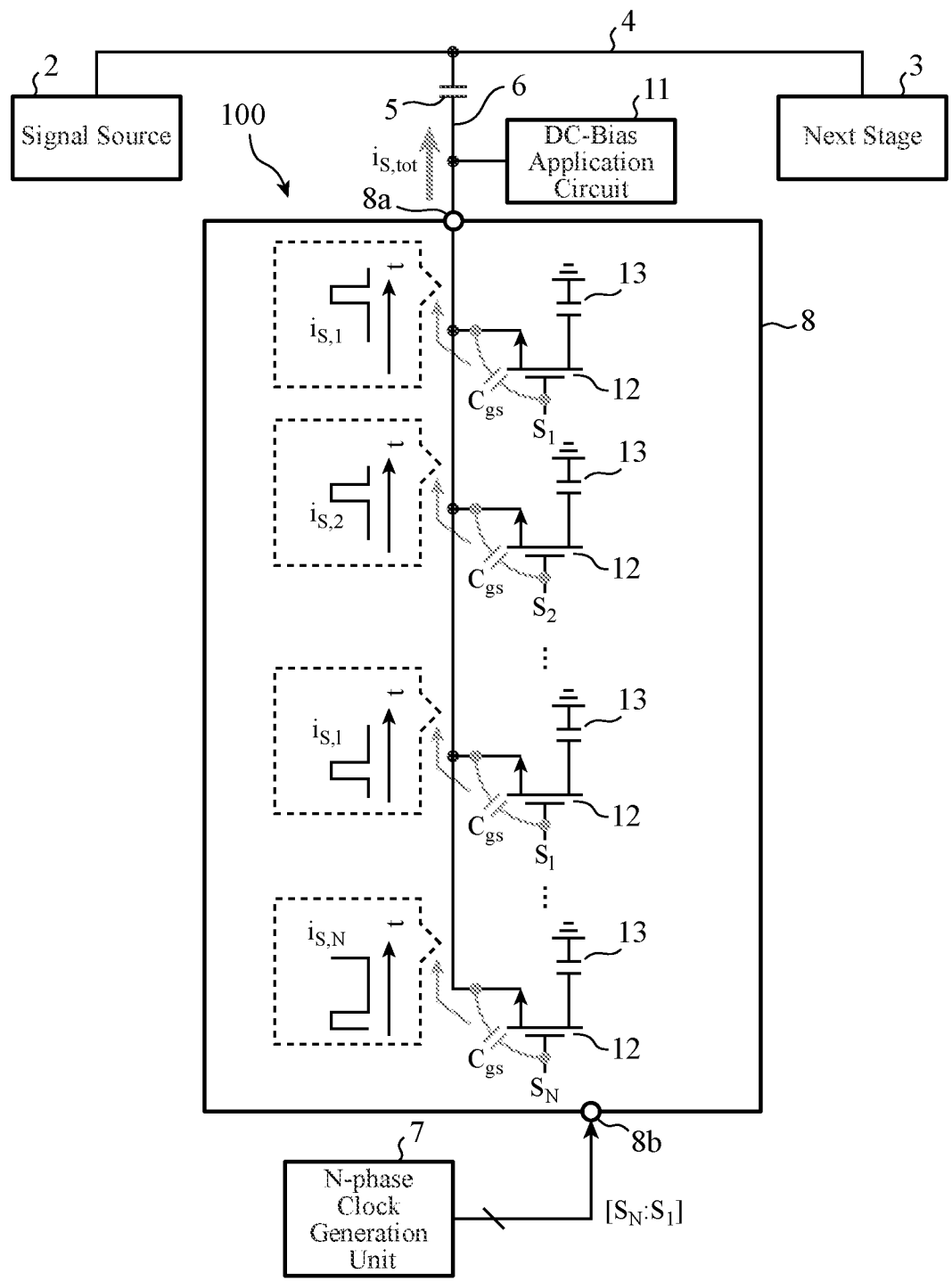
FIG. 4 is a circuit diagram showing a concrete configuration of a filter circuit which does not have a dummy unit.

FIG. 4 is a circuit diagram showing a concrete configuration of a filter circuit 100 which does not have the dummy unit 10. The filter circuit 100 is one in which the dummy unit 10 is excluded from the components of the filter circuit 1. As shown in FIG. 4, a filter unit 8 has N transistors 12 which constitute first phase to N-th phase paths, and the source terminal of each of the transistors 12 is connected to a signal line 6 and the drain terminal of each of the transistors 12 is connected to a grounded capacitor 13. The capacitor 13 has a baseband capacitance which determines the filter characteristics. Further, the capacitance of the capacitor 13 may be variable.

An N-phase clock generation unit 7 generates clock signals $S_1$ to $S_N$ of N phases. The clock signals $S_1$ to $S_N$ of N phases are respectively supplied to the paths for the first to N-th phases. Each transistor 12 electrically connects the capacitor 13 to the signal line 6 when a clock signal is applied to the gate terminal thereof. Because of this, the filter unit 8 functions as a bandpass filter in which the frequency $f_{LO}$ of each of the clock signals $S_1$ to $S_N$ of N phases is set as the center frequency of the pass band.

For example, when the frequency $f_{LO}$ of each of the clock signals of N phases is $f_{LO,1}$, as shown in FIG. 3, the filter unit 8 has the characteristics of a bandpass filter in which the frequency $f_{LO,1}$ is set as the center frequency of the pass band. Further, when the frequency $f_{LO}$ is changed to $f_{LO,2}$, the center frequency of the pass band of the filter unit 8 is also changed to $f_{LO,2}$. $f_{LO,2}$ is a frequency different from $f_{LO,1}$. When the frequency $f_{LO}$ is changed to $f_{LO,3}$, the center frequency of the pass band of the filter unit 8 becomes $f_{LO,3}$. $f_{LO,3}$ is a frequency different from $f_{LO,1}$ and $f_{LO,2}$.

The filter unit 8 can be made to perform a wideband operation by changing the frequency of each of the clock signals of N phases in this way.

As shown in FIG. 4, in the transistor 12 of each path included in the filter unit 8, a parasitic capacitance $C_{gs}$ is formed between the gate terminal and the source terminal. When the clock signals $S_1$ to $S_N$ are applied to the gate terminals, the currents $i_{S,1}$ to $i_{S,N}$ of the clock signals $S_1$ to $S_N$ leak out to the signal line 6 via the parasitic capacitances $C_{gs}$. When the clock signals $S_1$ to $S_N$ are in an ideal state in which the on-time duration $T_{on}$ is precisely equal in each phase, as shown in FIG. 2, the sum total $i_{S,tot}$ of the currents $i_{S,1}$ to $i_{S,N}$ of the clock signals $S_1$ to $S_N$ leaking out to the signal line 6 is only a DC component. In this case, even though the total current $i_{S,tot}$ is outputted from the filter unit 8, via an RF signal terminal 8a, to the signal line 6, the total current $i_{S,tot}$ is blocked by a blocking capacitor 5 and is not supplied to a signal source 2, a next stage element 3, and a signal line 4.

However, when a time lag occurs in one of the phases of the clock signals of N phases, there may occur a spurious current caused by the leakage current of the clock signals.

Figure 5:
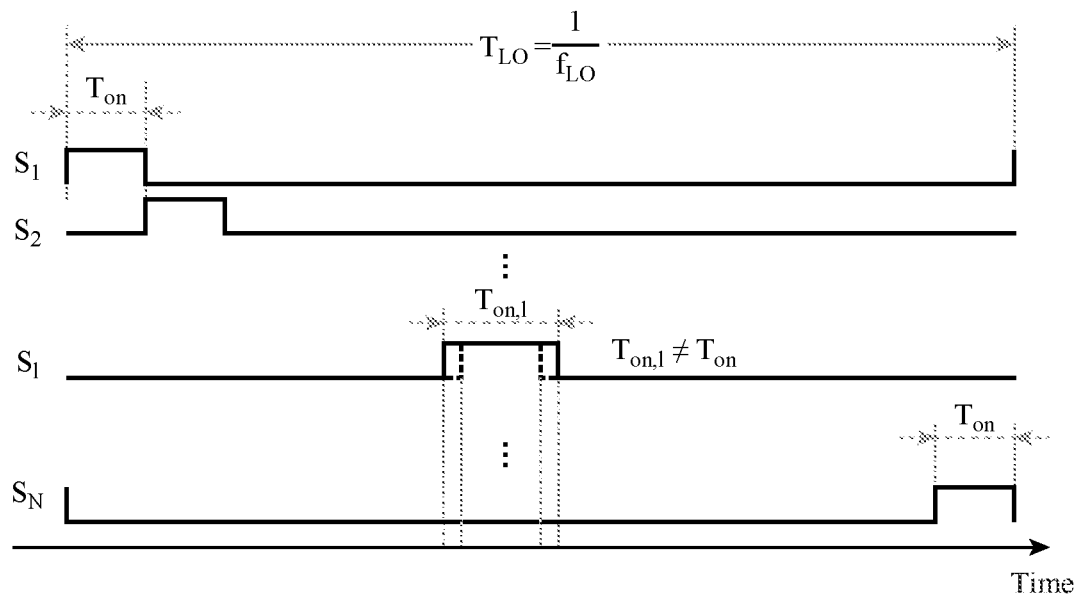
FIG. 5 is a waveform diagram showing the clock signals of N phases including a phase having a different on-time duration.

FIG. 5 is a waveform diagram showing the clock signals $S_1$ to $S_N$ of N phases including a phase having a different on-time duration $T_{on}$. The N-phase clock generation unit 7 may generate clock signals $S_1$ to $S_N$ of N phases including a phase having a different on-time duration $T_{on}$, for some reason. For example, there is a case in which the on-time duration $T_{on,1}$ of the clock signal Si of the first phase is longer than the on-time duration $T_{on}$ of the clock signal $S_1$ of any phase other than the first phase, as shown in FIG. 5.

Figure 6:
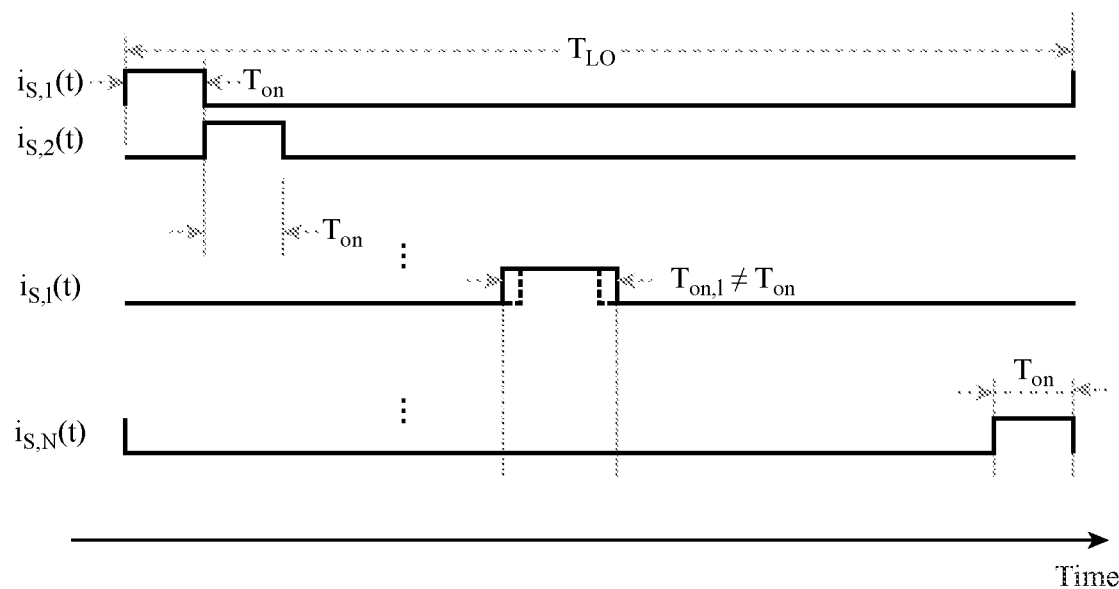
FIG. 6 is a waveform diagram showing the currents of the clock signals of N phases leaking out from a filter unit.

FIG. 6 is a waveform diagram showing the currents of the clock signals $S_1$ to $S_N$ of N phases leaking out from the filter unit 8, and shows the time waveforms $i_{S,i}(t)$ to $i_{S,N}(t)$ of the currents. In FIG. 6, the currents $i_{S,1}(t)$ to $i_{S,N}(t)$ shown in FIG. 5 and caused by the clock signals $S_1$ to $S_N$ leak out to the signal line 6 via the parasitic capacitance $C_{gs}$ of each of the N transistors 12 included in the filter unit 8.

Figure 7:
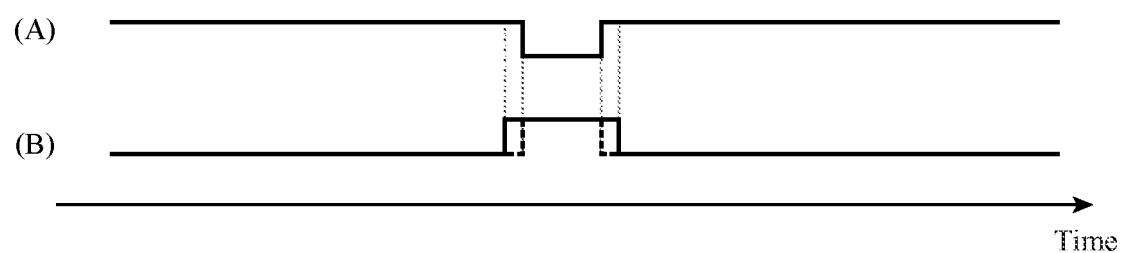
FIG. 7 is a waveform diagram showing the waveform of the sum total of the currents of clock signals leaking out from paths for the phases other than a first phase in the filter unit, and the waveform of the current of a clock signal leaking out from a path for the first phase.

FIG. 7 is a waveform diagram showing the waveform of the sum total of the currents of the clock signals leaking out from the paths for the phases other than the first phase in the filter unit 8, and the waveform of the current of the clock signal leaking out from the path for the first phase. In FIG. 7, the waveform (A) is the time waveform of the sum total of the currents $i_{S,n}(t)$ of the clock signals Sn leaking out from the paths for the phases other than the first phase to the signal line 6. n is a natural number ranging from 1 to N and being other than 1. The waveform (B) is the time waveform of the current $i_{S,1}(t)$ of the clock signal $S_1$ leaking out from the path for the first phase to the signal line 6. Because the on-time duration $T_{on,1}$ is longer than the on-time duration $T_{on}$, the waveforms (A) and (B) do not have levels which are inverse to each other.

Figure 8:
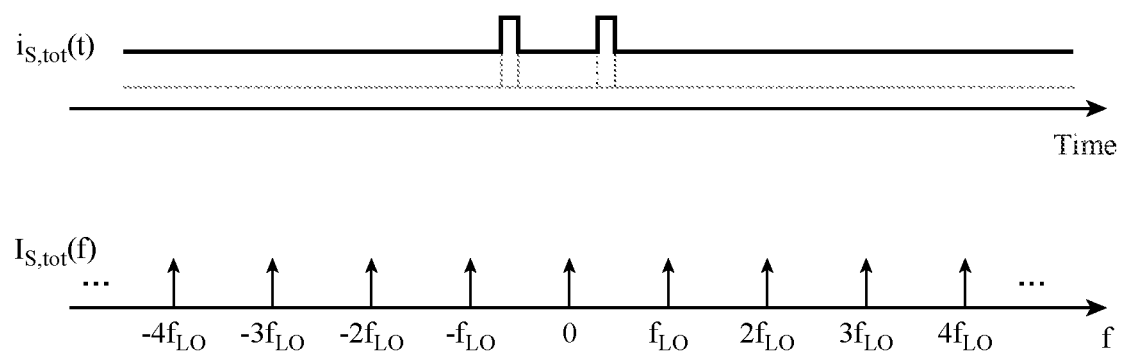
FIG. 8 is a view showing the frequency characteristic of the sum total of the currents of the clock signals of N phases leaking out from the filter unit.

FIG. 8 is a view showing the frequency characteristics of the sum total of the currents of the clock signals $S_1$ to $S_N$ of N phases leaking out from the filter unit 8. As shown in FIG. 7, the waveforms (A) and (B) do not have levels which are inverse to each other. Because of this, the difference between the currents $i_{S,n}(t)$ and the current $i_{S,1}(t)$ remains in the sum total $i_{S,tot}(t)$ of the currents $i_{S,n}(t)$ and the current $i_{S,1}(t)$, as shown in an upper part of FIG. 8. Because of this difference, the frequency characteristics $I_{S,tot}(f)$ of the total current $i_{S,tot}(t)$ have frequency components each having a frequency which is an integral multiple of the frequency $f_{LO}$ of each of the clock signals $S_1$ to $S_N$, as shown in a lower part of FIG. 8. Because the currents of the frequency components each having a frequency which is an integral multiple of the frequency $f_{LO}$ pass through the blocking capacitor 5, the currents are outputted, as spurious components, to the next stage element 3.

Figure 9:
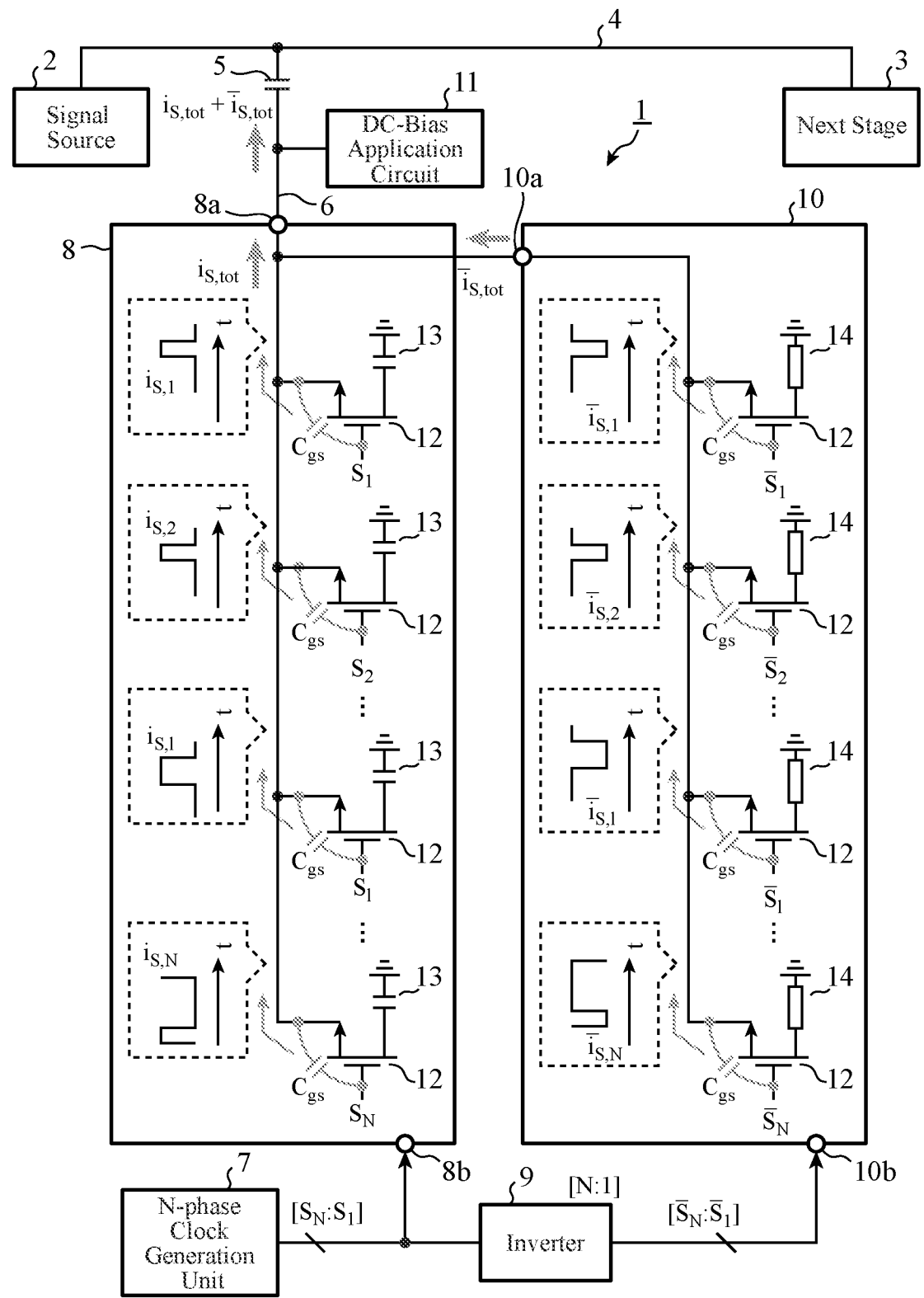
FIG. 9 is a circuit diagram showing a concrete configuration of the filter circuit according to Embodiment 1.

The filter circuit 1 includes the inverter 9 and the dummy unit 10 in order to suppress the above-mentioned spurious components. FIG. 9 is a circuit diagram showing a concrete configuration of the filter circuit 1. As shown in FIG. 9, the dummy unit 10 includes the N transistors 12 which constitute the first phase to N-th phase dummy paths. The source terminals of the N transistors 12 is connected to the signal line 6, and the drain terminals of the N transistors 12 are connected to the grounded impedance parts 14.

The inverter 9 inverts the clock signals $S_1$ to $S_N$ of N phases, to generate inverted signals $S_1$ bar to $S_N$ bar of N phases.

The inverted signals $S_1$ bar to $S_N$ bar of N phases are supplied to the dummy path for a corresponding phase out of the first phase to N-th phase dummy paths. The transistors 12 in the first phase to N-th phase dummy paths electrically connect the impedance parts 14 to the signal line 6 when the inverted signals are applied to the gate terminals thereof.

The impedance parts 14 are elements having impedance which is sufficiently high compared with the impedance $Z_s$ seen at the signal source 2 and the impedance $Z_L$ seen at the next stage element 3. Because the impedance parts 14 have impedance which is sufficiently high compared with that of the signal source 2 and that of the next stage element 3, the input of the RF signal from the signal source 2 to the dummy unit 10 is reduced. Because of this, the influence which the dummy unit 10 exerts on the filter characteristics of the filter unit 8 can be reduced in the filter circuit 1.

As shown in FIG. 9, a parasitic capacitance $C_{gs}$ is formed between the gate terminal and the source terminal of the transistor 12 in each of the dummy paths. The currents $i_{S,1}$ bar to $i_{S,N}$ bar of the inverted signals $S_1$ bar to $S_N$ bar of N phases leak out to the signal line 6 via the above-mentioned parasitic capacitances $C_{gs}$. When the clock signals $S_1$ to $S_N$ are in an ideal state in which their on-time durations $T_{on}$ are precisely equal, the sum total $i_{S,tot}$ bar of the currents $i_{S,1}$ bar to $i_{S,N}$ bar of the inverted signals $S_1$ bar to $S_N$ bar is also only a DC component. In this case, even though the total current $i_{S,tot}$ bar is outputted from the dummy unit 10, via the RF signal terminal 10a, to the signal line 6, the total current $i_{S,tot}$ bar is not supplied to the signal source 2, the next stage element 3, and the signal line 4 because the total current $i_{S,tot}$ bar is blocked by the blocking capacitor 5.

The duration of off time during which the inverted signal $S_1$ bar of the first phase has an off level is equal to the on-time duration $T_{on,1}$ of the corresponding clock signal $S_1$ of the first phase. The duration of on time during which the inverted signal $S_1$ bar of the first phase has an on level is $T_{LO}-T_{on,1}$. When a time lag occurs in one of the phases of the clock signals of N phases, a time lag also occurs in a corresponding one of the phases of the inverted signals. When the on-time duration $T_{on,1}$ of the clock signal $S_1$ of the first phase is longer than the on-time duration $T_{on}$ of the clock signal of any phase other than the first phase, the off-time duration of the inverted signal $S_1$ bar of the first phase is also longer than the off-time duration of the inverted signal of any phase other than the first phase by the time difference.

Figure 10:
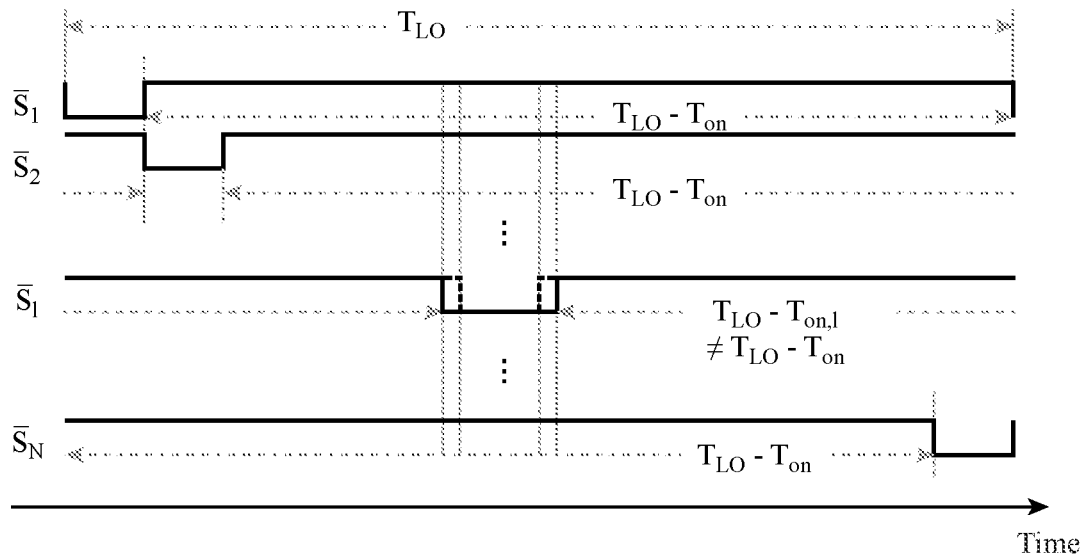
FIG. 10 is a waveform diagram showing inverted signals of N phases.

FIG. 10 is a waveform diagram showing the inverted signals $S_1$ bar to $S_N$ bar of N phases. As shown in FIG. 10, the inverted signals $S_1$ bar to $S_N$ bar of N phases have the same period $T_{LO}$ as the clock signals $S_1$ to $S_N$ of N phases. The inverted signals $S_1$ bar to $S_N$ bar of N phases are supplied, respectively, to the first phase to N-th phase dummy paths in the dummy unit 10 during each period of $T_{LO}$. Further, the clock signals $S_1$ to $S_N$ of N phases are also supplied, respectively, to the first phase to N-th phase paths in the filter unit 8 during each period of $T_{LO}$, as shown in FIG. 10.

Figure 11:
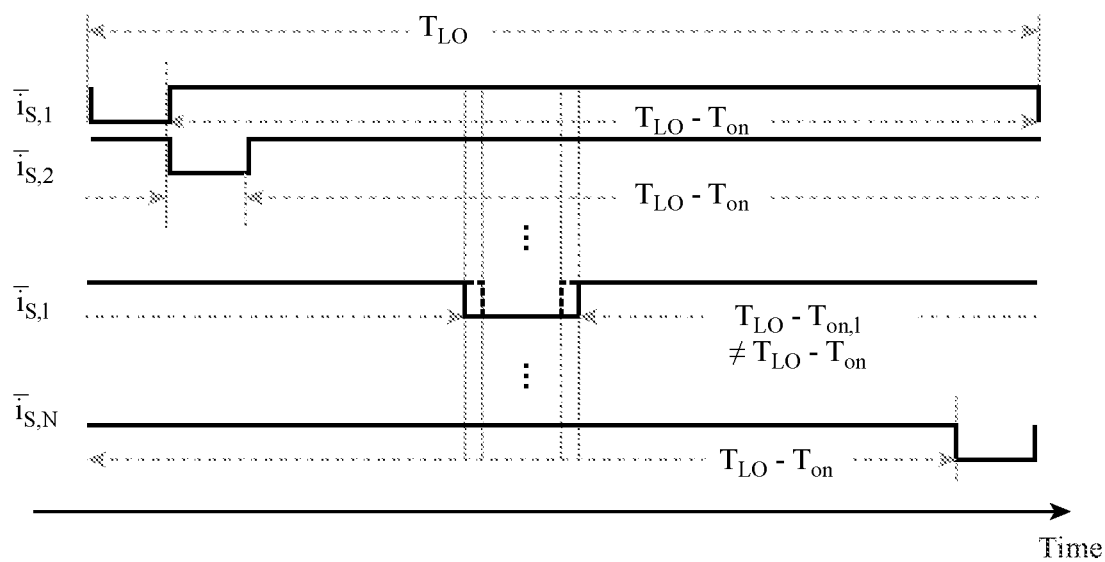
FIG. 11 is a waveform diagram showing the currents of the inverted signals of N phases leaking out from a dummy unit.

FIG. 11 is a waveform diagram showing the currents of the inverted signals of N phases leaking out from the dummy unit 10. When the inverted signals $S_1$ bar to $S_N$ bar which are shown in FIG. 10 are supplied to the dummy unit 10, the currents $i_{S,1}(t)$ bar to $i_{S,N}(t)$ bar leak out to the signal line 6 via the parasitic capacitances $C_{gs}$ of the transistors 12. Further, also in the filter unit 8, when the clock signals $S_1$ to $S_N$ are supplied to the filter unit 8, the currents $i_{S,1}(t)$ to $i_{S,N}(t)$ leak out to the signal line 6 via the parasitic capacitances $C_{gs}$ of the transistors 12.

Figure 12:
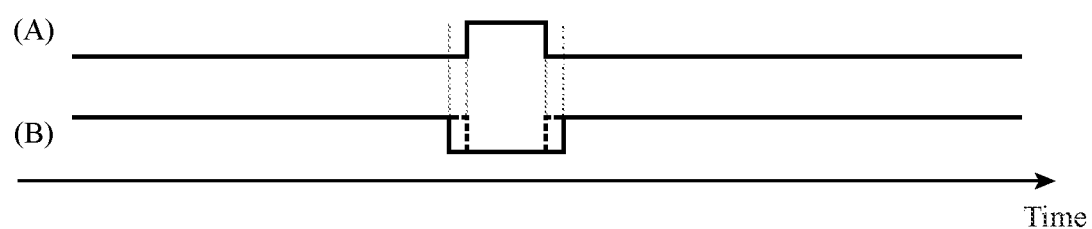
FIG. 12 is a waveform diagram showing the waveform of the sum total of the currents of inverted signals leaking out from dummy paths for the phases other than the first phase in the dummy unit, and the waveform of the current of an inverted signal leaking out from a dummy path for the first phase.

FIG. 12 is a waveform diagram showing the waveform of the sum total of the currents of the inverted signals leaking out from the paths for the phases other than the first phase in the dummy unit 10, and the waveform of the current of the inverted signal leaking out from the path for the first phase. In FIG. 12, the waveform (A) is the waveform of the sum total of the currents $i_{S,n}(t)$ bar of the inverted signals leaking out from the dummy paths other than the dummy path for the first phase to the signal line 6. The waveform (B) is the waveform of the current $i_{S,1}(t)$ bar of the inverted signal leaking out from the dummy path for the first phase to the signal line 6.

Because the off-time duration of the inverted signal $S_1$ bar of the first phase is longer than the off-time duration of the inverted signal of any phase other than the first phase, the waveforms (A) and (B) do not have levels which are inverse to each other, as shown in FIG. 12. However, the waveform (A) shown in FIG. 7 and the waveform (A) shown in FIG. 12 have levels which are inverse to each other because the on-time duration and the off-time duration are equal. Because the on-time duration of the clock signal $S_1$ of the first phase and the off-time duration of the inverted signal $S_1$ bar of the first phase are equal, the waveform (B) shown in FIG. 7 and the waveform (B) shown in FIG. 12 have levels which are inverse to each other.

Figure 13:
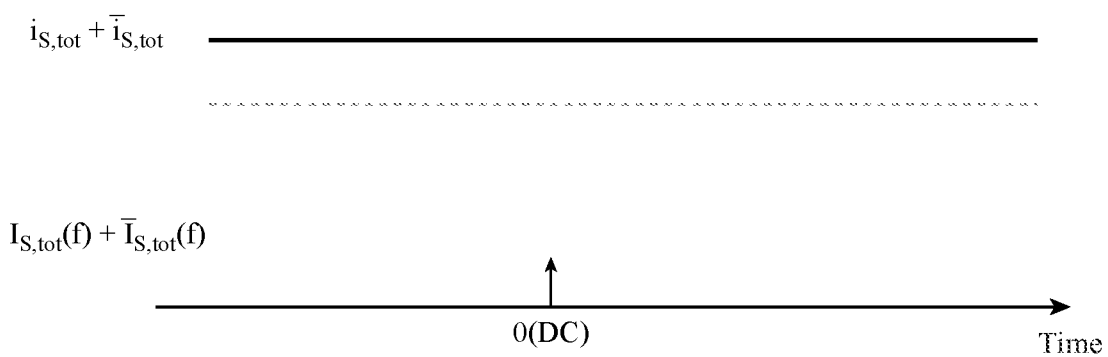
FIG. 13 is a view in which the frequency characteristic of the sum of the sum total of the currents of the clock signals of N phases leaking out from the filter unit, and the sum total of the currents of the inverted signals of N phases leaking out from the dummy unit.

FIG. 13 is a view showing the frequency conversion characteristic of the sum of the sum total $i_{S,tot}(t)$ of the currents of the clock signals of N phases leaking out from the filter unit 8, and the sum total $i_{S,tot}(t)$ bar of the currents of the inverted signals leaking out from the dummy unit 10. The current $i_{S,tot}(t)$ is outputted from the filter unit 8, via the RF signal terminal 8a, to the signal line 6, and the current $i_{S,tot}(t)$ bar is outputted from the dummy unit 10, via the RF signal terminal 10a, to the signal line 6.

The time waveform of the current $i_{S,tot}(t)$ and the time waveform of the current $i_{S,tot}(t)$ bar have levels which are inverse to each other. When both the currents outputted to the signal line 6 are added, the currents cancel each other out, as shown in an upper part of FIG. 13. The frequency characteristics $I_{S,tot}(t)+I_{S,tot}(t)$ bar of the currents $i_{S,tot}(t)+i_{S,tot}(t)$ bar are only a DC component, as shown in a lower part of FIG. 13. Therefore, even when the currents $i_{S,tot}+i_{S,tot}$ bar are outputted to the signal line 6, the currents are blocked by the blocking capacitor 5 and are not supplied to the signal source 2, the next stage element 3, and the signal line 4.

In the filter circuit 1, even when a clock signal with a phase having a different on-time duration is included in one of the clock signals of N phases, the current pulses of the clock signals and the current pulses of the inverted signals cancel each other out and only a DC component remains, and no spurious current is outputted to the next stage element 3. Therefore, because the filter circuit 1 can suppress spurious components even though the filter circuit does not use differential signal lines, and can perform a wideband operation because the filter circuit does not need a balun.

Next, variants of the filter circuit 1 will be explained.

Figure 14:
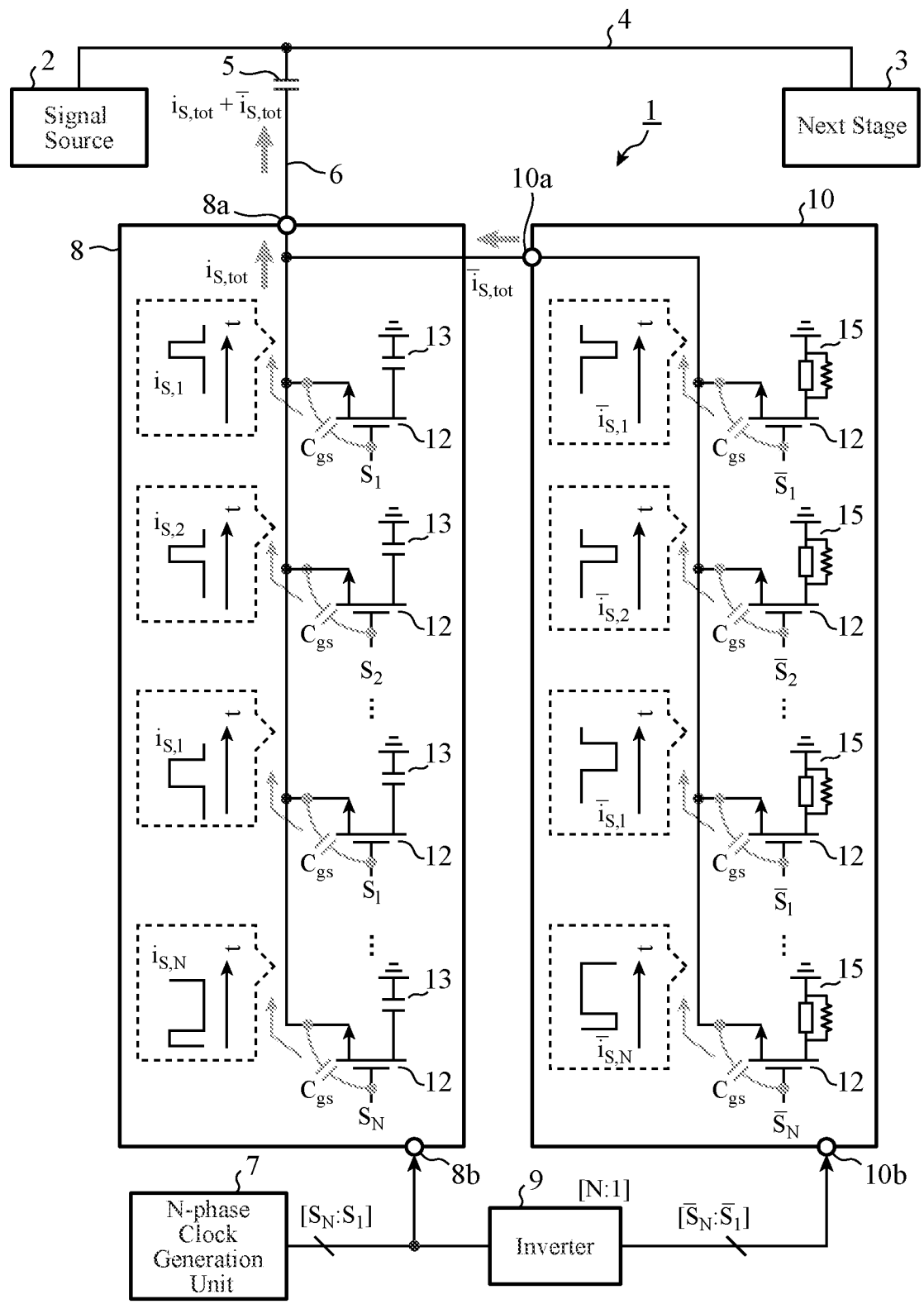
FIG. 14 is a circuit diagram showing the configuration of a first variant of the filter circuit according to Embodiment 1.

FIG. 14 is a circuit diagram showing the configuration of a first variant of the filter circuit 1. The first variant of the filter circuit 1 includes N transistors 12 which constitute first phase to N-th phase dummy paths, but does not include a DC bias application circuit 11, as shown in FIG. 14. Each of the transistors 12 has a source terminal to which a signal line 6 is connected, and a drain terminal to which a grounded impedance part 15 is connected. The impedance part 15 is an element through which a DC component passes, and is an element in which an impedance part 14 and a resistor are connected in parallel, for example.

By supplying inverted signals to the transistors 12, N-1 transistors 12, out of the N transistors, electrically connect impedance parts 15 to the signal line 6. Each of the resistors which constitute the impedance parts 15 conducts a DC component, and ground potential is applied, as a DC bias, to the signal line 6. Because of this, a DC bias application circuit 11 can be omitted and the circuit area can be reduced in the first variant of the filter circuit 1.

Figure 15:
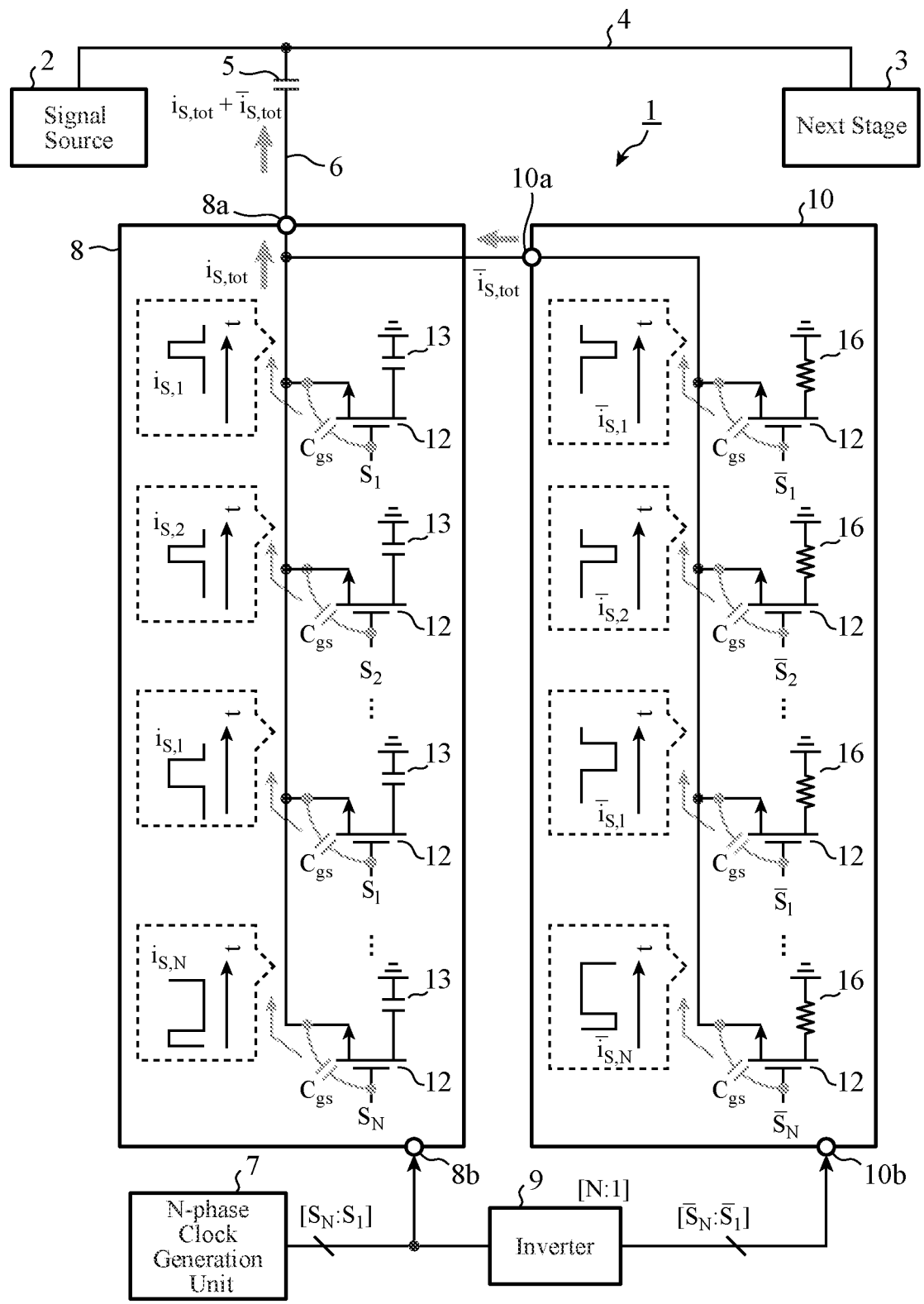
FIG. 15 is a circuit diagram showing the configuration of a second variant of the filter circuit according to Embodiment 1.

FIG. 15 is a circuit diagram showing the configuration of a second variant of the filter circuit 1. The second variant of the filter circuit 1 includes N transistors 12 which constitute first phase to N-th phase dummy paths, but does not include a DC bias application circuit 11, as shown in FIG. 15. Each of the transistors 12 has a source terminal to which a signal line 6 is connected, and a drain terminal to which a grounded impedance part 16 is connected. The impedance part 16 is a resistive element having a resistance value which is sufficiently high compared with impedance $Z_s$ seen at a signal source 2 and impedance $Z_L$ seen at a next stage element 3.

By supplying inverted signals of N phases to the N transistors 12 included in a dummy unit 10, N−1 transistors 12, out of the N transistors, electrically connect impedance parts 16 which are resistors to the signal line 6. Each of the resistors which are the impedance parts 16 conducts a DC component, and ground potential is applied, as a DC bias, to the signal line 6. Because of this, a DC bias application circuit 11 can be omitted and the circuit area can be reduced in the second variant of the filter circuit 1.

Figure 16:
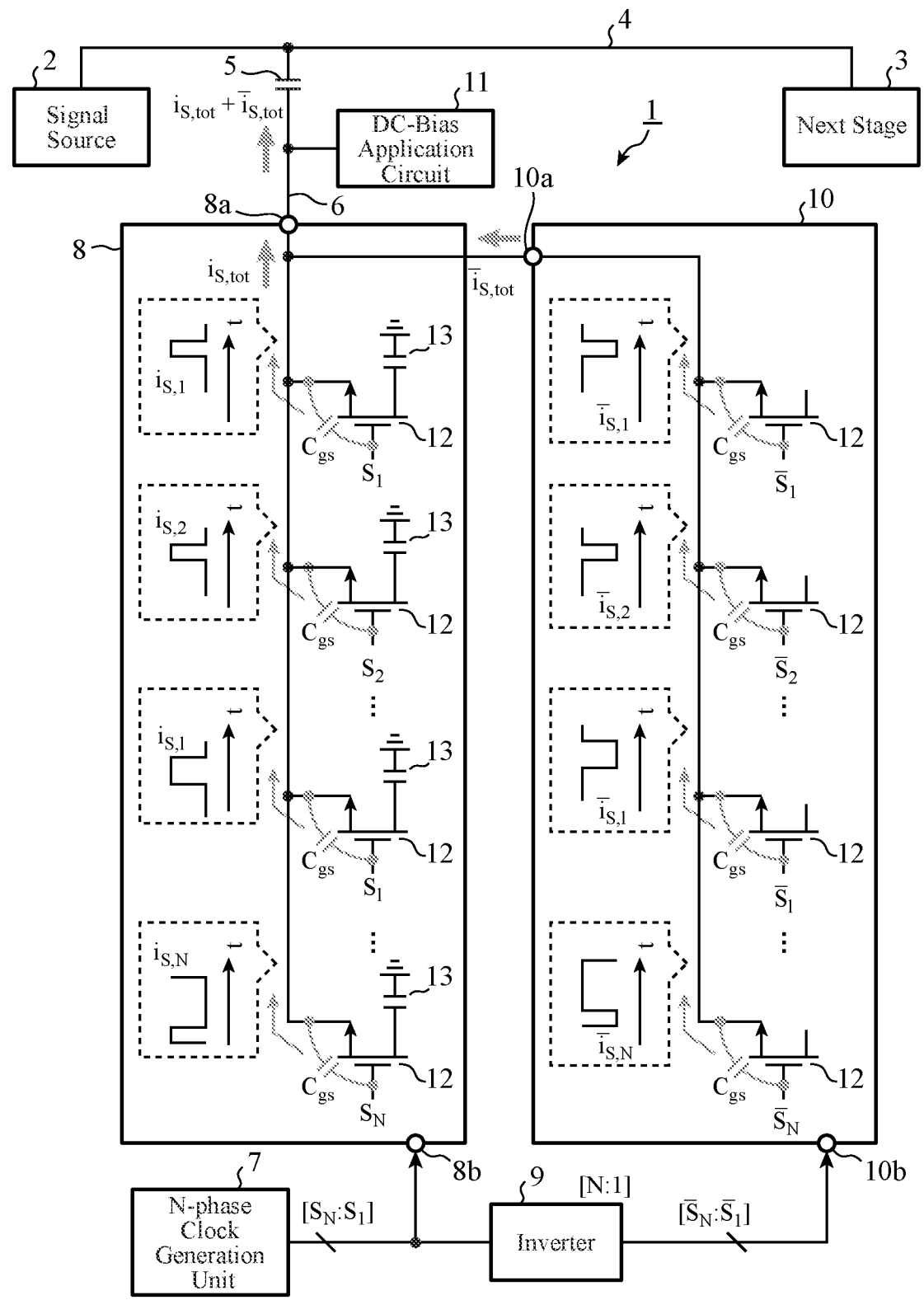
FIG. 16 is a circuit diagram showing the configuration of a third variant of the filter circuit according to Embodiment 1.

FIG. 16 is a circuit diagram showing the configuration of a third variant of the filter circuit 1. The third variant of the filter circuit 1 includes N transistors 12 which constitute first phase to N-th phase dummy paths, as shown in FIG. 16. A source terminal of each of the transistors 12 is connected to a signal line 6, while a drain terminal of each of the transistors 12 is an open end (open).

By supplying inverted signals of N phases to the N transistors 12 included in a dummy unit 10, N−1 transistors 12, out of the N transistors 12, electrically connect their open ends to the signal line 6. The open ends can be assumed to be resistors which are sufficiently high compared with impedance $Z_s$ seen at a signal source 2 and impedance $Z_L$ seen at a next stage element 3. Therefore, the third variant of the filter circuit 1 can reduce the influence which an RF signal inputted to the dummy unit 10 exerts on the filter characteristics of a filter unit 8. Because of this, it is not necessary to dispose elements as impedance parts, and therefore the circuit area of the filter circuit 1 can be reduced.

As mentioned above, in the filter circuit 1 according to Embodiment 1, clock signals of N phases are applied to the N transistors 12 included in the filter unit 8, and inverted signals of N phases are applied to the N transistors 12 included in the dummy unit 10. Because the currents of the clock signals leaking out from the filter unit 8 and the currents of the inverted signals leaking out from the dummy unit 10 cancel each other out, the filter circuit 1 can suppress spurious components even though the filter circuit does not use differential signal lines, and can perform a wideband operation because the filter circuit does not need a balun.

In the filter circuit 1 according to Embodiment 1, each impedance part 14 is an element which has impedance which is sufficiently high compared with the impedance $Z_s$ seen at the signal source 2 and the impedance $Z_L$ seen at the element 3 which is a next stage following the signal source 2. Because of this, the filter circuit 1 can reduce the influence which the RF signal inputted to the dummy unit 10 exerts on the filter characteristics of the filter unit 8.

In the filter circuit 1 according to Embodiment 1, because each impedance part 15 is an element through which a DC component passes, ground potential can be applied, as a DC bias, to the signal line 6. Because of this, the DC bias application circuit 11 can be omitted and the circuit area can be reduced in the filter circuit 1.

In the filter circuit 1 according to Embodiment 1, because each impedance part 16 is a resistor, ground potential can be applied, as a DC bias, to the signal line 6. Because of this, the DC bias application circuit 11 can be omitted and the circuit area can be reduced in the filter circuit 1.

In the filter circuit 1 according to Embodiment 1, each impedance part is an open end of a transistor 12. Accordingly, because it is not necessary to dispose an element as each impedance part in the filter circuit 1, the circuit area can be reduced.

Embodiment 2

Figure 17:
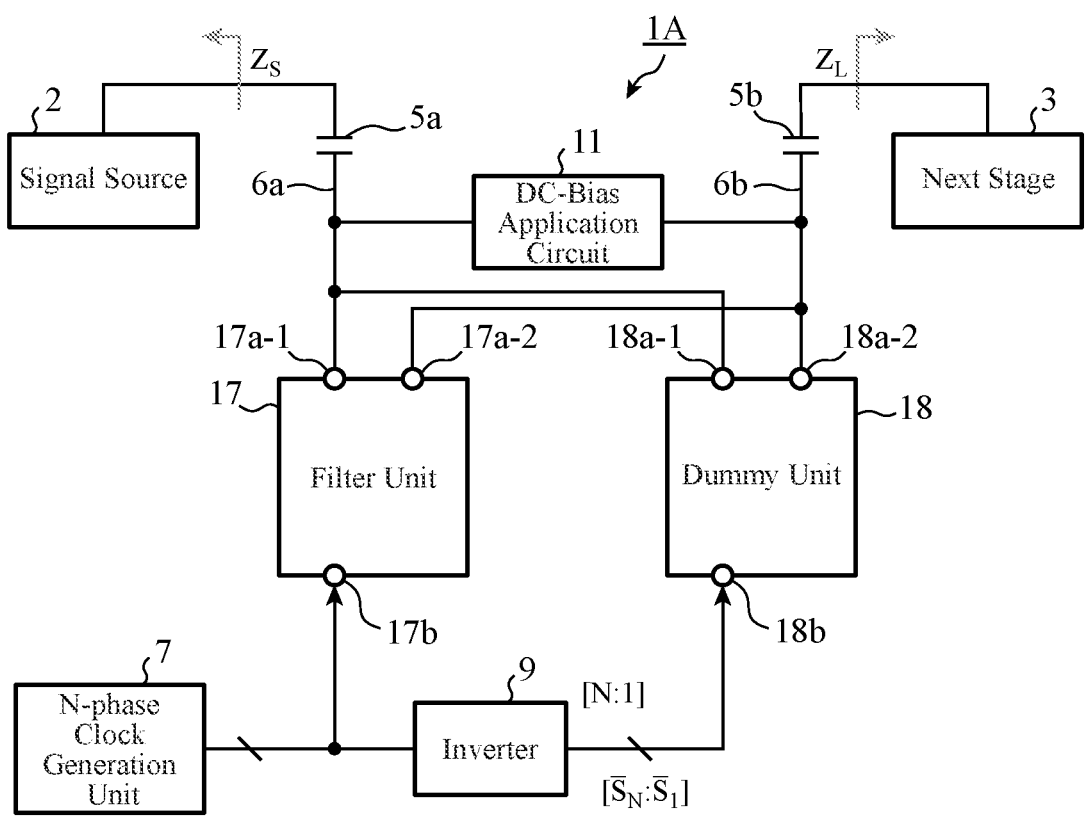
FIG. 17 is a block diagram showing a filter circuit according to Embodiment 2.

FIG. 17 is a block diagram showing a filter circuit 1A according to Embodiment 2. In FIG. 17, the filter circuit 1A is an N-path filter having N parallel paths which are multiple phases, and removes a part within a band from an RF signal from a signal source 2 and outputs the RF signal after removal to a next stage element 3. N is an integer greater than or equal to 2. The filter circuit 1A includes a signal line 6a, a signal line 6b, an N-phase clock generation unit 7, an inverter 9, a DC bias application circuit 11, a filter unit 17, and a dummy unit 18. The signal line 6a is connected in series to a blocking capacitor 5a. The signal source 2 and the filter unit 17 are connected by the signal line 6a. The signal line 6b is connected in series to a blocking capacitor 5b. The signal source 2 and the dummy unit 18 are connected by the signal line 6b.

The signal source 2 generates an RF signal which is to be supplied, via the signal lines 6a and 6b, to the filter circuit 1A and the next stage element 3. In FIG. 17, impedance $Z_s$ is one seen from an output side of the signal source 2. The next stage element 3 is disposed as a next stage following the signal source 2, and receives the RF signal generated by the signal source 2. Impedance $Z_L$ is one seen from an input side of the next stage element 3. The blocking capacitor 5a blocks a DC component occurring in the filter unit 17, to isolate the DC component from the signal source 2, and the blocking capacitor 5b blocks a DC component occurring in the dummy unit 18, to isolate the DC component from the next stage element 3.

The N-phase clock generation unit 7 generates clock signals $S_1$ to $S_N$ of N phases. The clock signals of N phases generated by the N-phase clock generation unit 7 are supplied, via an N-phase clock terminal 17b, to the filter unit 17, and are further supplied to the inverter 9. The inverter 9 inverts the polarities of the clock signals of N phases, to output inverted signals of N phases. The inverted signals of N phases generated by the inverter 9 are supplied, via an inverted signal terminal 18b, to the dummy unit 18.

The filter unit 17 is a two-port N-path filter having an RF signal terminal 17a-1 via which the RF signal is inputted, an RF signal terminal 17a-2 via which the RF signal is outputted to the signal line 6b, and the N-phase clock terminal 17b via which the clock signals of N phases are inputted. The filter unit 17 includes first phase to N-th phase paths, and each of the paths includes a pair of transistors connected in series. One transistor of the transistor pair is connected to the signal line 6a, and a point of connection between the transistors of the transistor pair is connected to a grounded capacitor.

With the clock signals of N phases applied to the N pairs of transistors included in the filter unit 17, one of the N pairs of transistors electrically connects a capacitor to the signal lines 6a and 6b. More specifically, each of the paths is a switched capacitor which switches between an electrical connection and an electrical disconnection between a capacitor and the signal lines 6a and 6b.

The dummy unit 18 is a circuit which has an RF signal terminal 18a-1 via which the RF signal is inputted, an RF signal terminal 18a-2 via which the RF signal is outputted to the signal line 6b, and the inverted signal terminal 18b via which the inverted signals of N phases are inputted, and which is configured by following a two-port N-path filter. The dummy unit 18 has first phase to N-th phase dummy paths which correspond to the first phase to N-th phase paths in the filter unit 17, and each of the dummy paths includes N pairs of transistors.

One transistor included in each transistor pair is connected to the signal line 6a, a point of connection between the transistors included in each transistor pair is connected to a grounded impedance part, and the other transistor included in each transistor pair is connected to the signal line 6b. The signal line 6b is connected to one of the transistors included in each transistor pair included in the filter unit 17.

The impedance part has impedance which is sufficiently high compared with that of the signal source 2 and that of the next stage element 3. In the N pairs of transistors included in the dummy unit 18, N−1 pairs of transistors, out of the N pairs of transistors, electrically connect impedance parts to the signal lines 6a and 6b when the inverted signals of N phases are applied thereto. More specifically, each of the dummy paths is switched impedance which switches between an electrical connection and an electrical disconnection between an impedance part and the signal lines 6a and 6b.

The DC bias application circuit 11 determines a DC bias voltage (DC bias) in the signal lines 6a and 6b. The DC bias is a DC voltage for driving the N pairs of transistors included in each of the following units: the filter unit 17 and the dummy unit 18. The DC bias application circuit 11 is a shunt resistor, for example.

Figure 18:
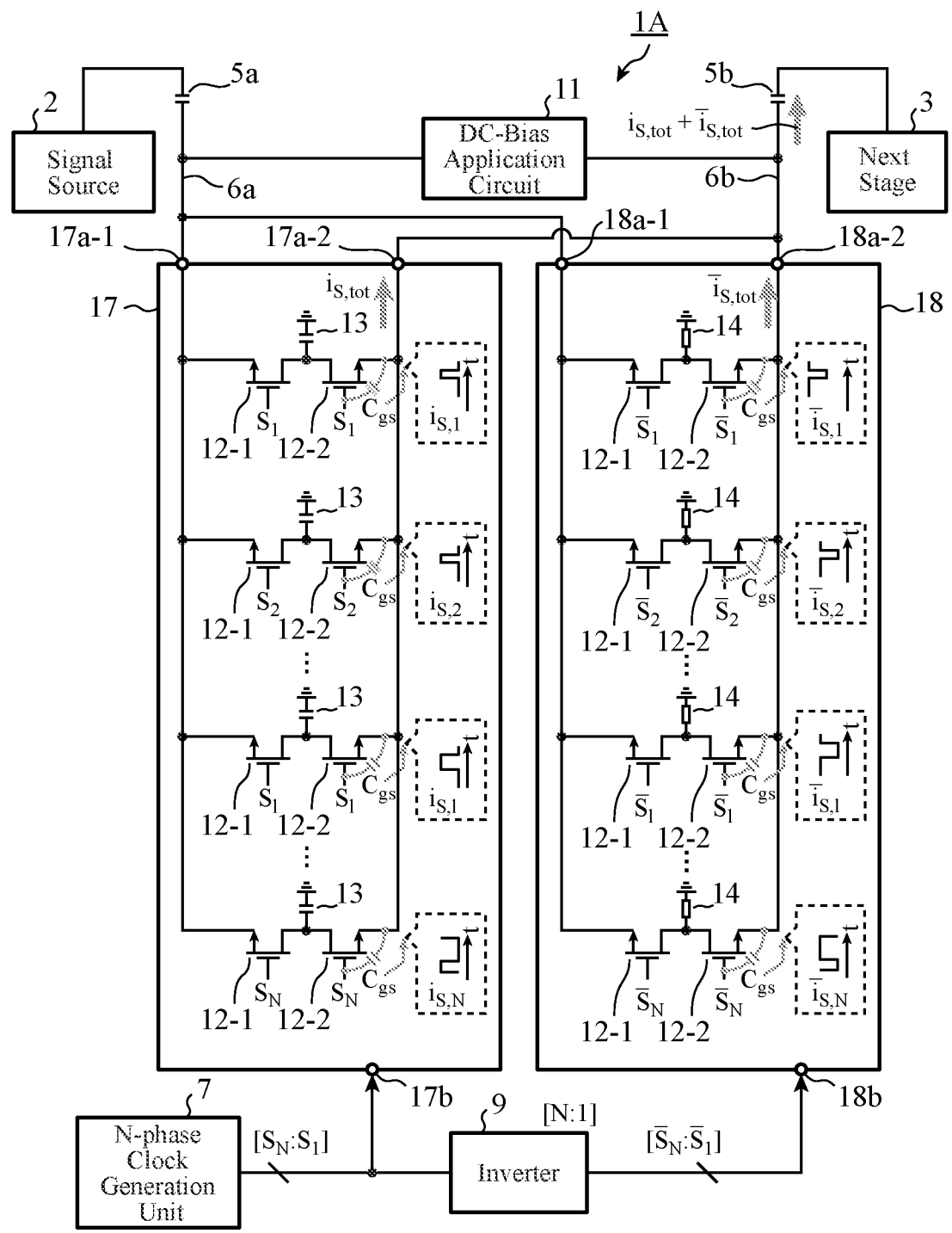
FIG. 18 is a circuit diagram showing a concrete configuration of the filter circuit according to Embodiment 2.

FIG. 18 is a circuit diagram showing a concrete configuration of the filter circuit 1A. In the filter unit 17, the transistor pair which constitutes each of the paths for the first to N-th phases includes transistors 12-1 and 12-2 connected in series. In each transistor pair, the source terminal of the transistor 12-1 is connected to the signal line 6a, and the source terminal of the transistor 12-2 is connected to the signal line 6b. Further, a point of connection between the transistors 12-1 and 12-2 is connected to a grounded capacitor 13. The capacitor 13 has a baseband capacitance which determines the filter characteristics. Further, the capacitance of the capacitor 13 may be variable.

The clock signals $S_1$ to $S_N$ of N phases generated by the N-phase clock generation unit 7 are supplied to the path for a corresponding phase out of the first phase to N-th phase paths in the filter unit 17. The transistors 12-1 and 12-2 in each of the paths, with a clock signal applied to their gate terminals, electrically connect the capacitor 13 to the signal lines 6a and 6b. Because of this, the filter unit 17 functions as a bandpass filter in which the frequency of each of the clock signals of N phases is the center frequency of a passband. Further, by changing the frequency of each of the clock signals of N phases, the center frequency of the passband of the filter unit 17 can be changed.

In the dummy unit 18, the N pairs of transistors which constitute the dummy paths for the first to N-th phases include transistors 12-1 and 12-2 connected in series. In each transistor pair, the source terminal of the transistor 12-1 is connected to the signal line 6a, the source terminal of the transistor 12-2 is connected to the signal line 6b, and a point of connection between the transistors 12-1 and 12-2 is connected to a grounded impedance part 14. The impedance part 14 is an element having impedance which is sufficiently high compared with the impedance $Z_s$ seen at the signal source 2 and the impedance $Z_L$ seen at the next stage element 3.

The inverted signals $S_1$ bar to $S_N$ bar of N phases generated by the inverter 9 are supplied to the dummy path for a corresponding phase out of the first phase to N-th phase dummy paths in the dummy unit 18. The transistors 12-1 and 12-2 in each of the dummy paths, by applying an inverted signal to their gate terminals, electrically connect an impedance part 14 to the signal lines 6a and 6b. Because the impedance part 14 has impedance which is sufficiently high compared with that of the signal source 2 and that of the next stage element 3, the input of the RF signal from the signal source 2 to the dummy unit 18 is reduced. Because of this, the filter circuit 1A can reduce the influence which the dummy unit 18 exerts on the filter characteristics of the filter unit 17.

In the transistor 12-2 of the transistor pair in each of the paths, a parasitic capacitance $C_{gs}$ is formed between the gate terminal and the source terminal. The currents $i_{S,1}$ to $i_{S,N}$ of the clock signals $S_1$ to $S_N$ applied to the gate terminals of the transistors 12-2 leak out, via the above-mentioned parasitic capacitances $C_{gs}$, to the signal line 6b. When the clock signals $S_1$ to $S_N$ are in an ideal state in which the on-time duration $T_{on}$, is precisely equal in each phase, the sum total of the currents of the clock signals $S_1$ to $S_N$ leaking out to the signal line 6b is only a DC component. This total current is blocked by the blocking capacitor 5b and is not supplied to the next stage element 3 even though the total current is outputted from the filter unit 17, via the RF signal terminal 17a-2, to the signal line 6b.

In the transistor 12-2 of the transistor pair in each of the dummy paths, a parasitic capacitance $C_{gs}$ is formed between the gate terminal and the source terminal. The currents $i_{S,1}$ bar to $i_{S,N}$ bar of the inverted signals $S_1$ bar to $S_N$ bar applied to the gate terminals of the transistors 12-2 leak out, via the above-mentioned parasitic capacitances $C_{gs}$, to the signal line 6b. When the clock signals $S_1$ to $S_N$ are in an ideal state in which their on-time durations $T_{on}$ are precisely equal, the sum total of the currents caused by the inverted signals $S_1$ bar to $S_N$ bar is also only a DC component. Because this total current is blocked by the blocking capacitor 5b even though the total current is outputted from the dummy unit 18 to the signal line 6b, the total current is not supplied to the next stage element 3.

Further, when a time lag occurs in one of the phases of the clock signals $S_1$ to $S_N$ of N phases, a time lag also occurs in a corresponding one of the phases of the inverted signals $S_1$ bar to $S_N$ bar. For example, the on-time duration $T_{on,1}$ of the clock signal $S_1$ of first phase and the off-time duration of the inverted signal $S_1$ bar of first phase are equal. Therefore, when the on-time duration $T_{on,1}$ is longer than the on-time duration of the clock signal of any phase other than the first phase, the off-time duration of the inverted signal $S_1$ bar of first phase is also longer than the off-time duration of the inverted signal of any phase other than the first phase.

In this case, the waveform A1 of the sum total of the currents of the clock signals leaking out from the paths for the phases other than the first phase to the signal line 6b, and the waveform A2 of the current of the clock signal leaking out from the path for the first phase to the signal line 6b do not have levels which are inverse to each other. Further, the waveform A3 of the sum total of the currents of the inverted signals leaking out from the dummy paths for the phases other than the first phase to the signal line 6b, and the waveform A4 of the current of the inverted signal leaking out from the path for the first phase to the signal line 6b do not have levels which are inverse to each other.

However, the waveforms A1 and A3 have levels which are inverse to each other because the on-time duration and the off-time duration are equal. Further, because the on-time duration of the clock signal $S_1$ of first phase and the off-time duration of the inverted signal $S_1$ bar of first phase are equal, the waveforms A2 and A4 have levels which are inverse to each other. Because of this, the frequency characteristics of the sum of the currents leaking out to the signal line 6b are only a DC component. Therefore, even though the sum current is outputted to the signal line 6b, the sum current is blocked by the blocking capacitor 5b and is not supplied to the next stage element 3.

In the filter circuit 1A, even when a clock signal with a phase having a different on-time duration is included in one of the clock signals of N phases, the current pulses of the clock signals and the current pulses of the inverted signals cancel each other out and only a DC component remains, and no spurious current is outputted to the next stage element 3. Because of this, the filter circuit 1A can suppress spurious components even though the filter circuit does not use differential signal lines, and can perform a wideband operation because the filter circuit does not need a balun.

Next, variants of the filter circuit 1A will be explained.

A first variant of the filter circuit 1A includes N pairs of transistors which are included in a dummy unit 18 and which constitute first phase to N-th phase dummy paths, but does not include a DC bias application circuit 11. In the filter circuit 1A, the source terminal of a transistor 12-1 in each of the transistor pairs of the N dummy paths is connected to a signal line 6a, and a point of connection between the transistor 12-1 and a transistor 12-2 in each of the transistor pairs is connected to an impedance part 15 shown in FIG. 14. The impedance part 15 is an element through which a DC component passes, and is an element in which an impedance part 14 and a resistor are connected in parallel, for example.

When inverted signals of N phases are supplied to the N pairs of transistors included in the dummy unit 18, N−1 pairs of transistors, out of the N pairs of transistors, electrically connect impedance parts 15 to signal lines 6a and 6b. Each of the resistors constitutes the impedance part 15 through which a DC component passes, so that ground potential is applied, as a DC bias, to the signal lines 6a and 6b. Therefore, a DC bias application circuit 11 can be omitted and the circuit area can be reduced in the first variant of the filter circuit 1A.

A second variant of the filter circuit 1A includes N pairs of transistors which are included in a dummy unit 18 and which constitute first phase to N-th phase dummy paths, but does not include a DC bias application circuit 11. In the filter circuit 1A, the source terminal of a transistor 12-1 in each of the transistor pairs of the N dummy paths is connected to a signal line 6a, and a point of connection between the transistor 12-1 and a transistor 12-2 in each of the transistor pairs is connected to an impedance part 16 shown in FIG. 15. The impedance part 16 is a resistive element having a resistance value which is sufficiently high compared with impedance $Z_s$ seen at a signal source 2 and impedance $Z_L$ seen at a next stage element 3.

Inverted signals of N phases are supplied to the N pairs of transistors, and N−1 pairs of transistors, out of the N pairs of transistors, electrically connect impedance parts 16 which are resistors to the signal line 6a and a signal line 6b. Each of the resistors is the impedance part 16 through which a DC component passes, so that ground potential is applied, as a DC bias, to the signal lines 6a and 6b. Therefore, a DC bias application circuit 11 can be omitted and the circuit area can be reduced in the second variant of the filter circuit 1A.

As mentioned above, in the filter circuit 1A according to Embodiment 2, the clock signals of N phases are applied, respectively, to the N pairs of transistors included in the filter unit 17, and the inverted signals of N phases are applied, respectively, to the N pairs of transistors included in the dummy unit 18. As a result, because the currents of the clock signals leaking out from the filter unit 17 and the currents of the inverted signals leaking out from the dummy unit 18 cancel each other out, the filter circuit 1A can suppress spurious components even though the filter circuit does not use differential signal lines, and can perform a wideband operation because the filter circuit does not need a balun.

Embodiment 3

Figure 19:
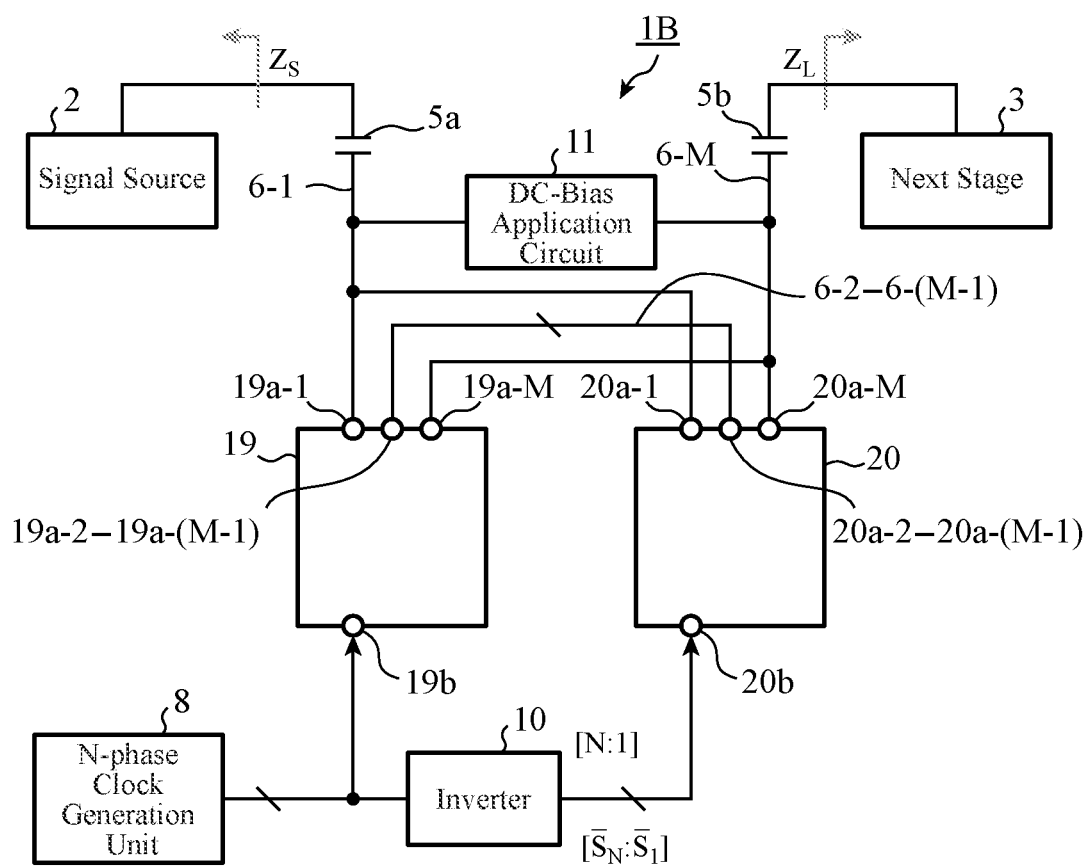
FIG. 19 is a block diagram showing a filter circuit according to Embodiment 3.

FIG. 19 is a block diagram showing a filter circuit 1B according to Embodiment 3. In FIG. 19, the filter circuit 1B is an N-path filter having N parallel paths which are multiple phases, removes a part within a band from an RF signal from a signal source 2, and outputs the RF signal after removal to a next stage element 3. The filter circuit 1B includes signal lines 6-1 to 6-M, an N-phase clock generation unit 7, an inverter 9, a DC bias application circuit 11, a filter unit 19, and a dummy unit 20. M is an integer greater than or equal to 2.

The signal source 2 generates an RF signal which is to be supplied to the filter circuit 1B and the next stage element 3. Impedance $Z_s$ is one seen from an output side of the signal source 2. The next stage element 3 is disposed as a next stage following the signal source 2, and receives the RF signal generated by the signal source 2. Impedance $Z_L$ is one seen from an input side of the next stage element 3.

The signal line 6-1 is connected in series to a blocking capacitor 5a. The signal line 6-M is connected in series to a blocking capacitor 5b. The blocking capacitor 5a isolates a DC component occurring in the filter unit 19 from the signal source 2, and the blocking capacitor 5b blocks a DC component occurring in the dummy unit 20, to isolate the DC component from the next stage element 3. The signal source 2 and the filter unit 19 are connected by the signal line 6-1. The signal source 2 and the dummy unit 20 are connected by the signal line 6b. The signal lines 6-2 to 6-(M−1) connect intermediate nodes of the filter unit 19 and intermediate nodes of the dummy unit 20.

The N-phase clock generation unit 7 generates clock signals $S_1$ to $S_N$ of N phases. The clock signals of N phases generated by the N-phase clock generation unit 7 are supplied, via an N-phase clock terminal 19b, to the filter unit 19, and are further supplied to the inverter 9. The inverter 9 inverts the polarities of the clock signals of N phases, to output inverted signals of N phases. The inverted signals of N phases generated by the inverter 9 are supplied, via an inverted signal terminal 20b, to the dummy unit 20.

The filter unit 19 is an M-port N-path filter having an RF signal terminal 19a-1, RF signal terminals 19a-2 to 19a-(M−1), an RF signal terminal 19a-M, and the N-phase clock terminal 19b. The RF signal terminal 19a-1 is a terminal via which the RF signal generated by the signal source 2 is inputted. The RF signal terminals 19a-2 to 19a-(M−1) are terminals via which the RF signal is outputted to the intermediate nodes. The RF signal terminal 19a-M is a terminal via which the RF signal is outputted to the next stage element 3. The N-phase clock terminal 19b is a terminal via which the clock signals of N phases are inputted. The filter unit 19 includes first phase to N-th phase paths, and each of the paths includes a transistor unit in which pairs of transistors are connected in cascade and transistors of each pair are connected in series. The intermediate nodes are the second to M−1-th transistor pairs in the transistor units.

In the filter unit 19, the first transistor (on one side) included in each transistor unit is connected to the signal line 6-1, and M-th transistor (on another side) included in each transistor unit is connected the signal line 6-M. Further, a point of connection between the transistors in each transistor pair is connected to a grounded capacitor. In the filter unit 19, by applying the clock signals of N phases to the N transistor units, one transistor unit, out of the N transistor units, electrically connects capacitors to the signal lines 6-1 to 6-M. Each of the paths is a switched capacitor which switches between an electrical connection and an electrical disconnection between capacitors and the signal lines 6-1 to 6-M.

The dummy unit 20 is a circuit which has an RF signal terminal 20a-1, RF signal terminals 2a-2 to 20a-(M−1), an RF signal terminal 20a-M, and the inverted signal terminal 20b, and which is configured by following an M-port N-path filter. The RF signal terminal 20a-1 is a terminal via which the RF signal is inputted. The RF signal terminals 20a-2 to 20a-(M−1) are terminals via which the RF signal is outputted to the intermediate nodes. The RF signal terminal 20a-M is a terminal via which the RF signal is outputted to the signal line 6-M. The inverted signal terminal 20b is a terminal via which the inverted signals of N phases are inputted from the inverter 9. The dummy unit 20 has first phase to N-th phase dummy paths which correspond to the first phase to N-th phase paths in the filter unit 19, and each of the dummy paths includes a transistor unit in which M pairs of transistors are connected in cascade, and transistors of each pair are connected in series.

The transistor which is the first one of the transistors included in each transistor unit is connected to the signal line 6-1, a point of connection between the transistors in each transistor pair included in each transistor unit is connected to a grounded impedance part, and the transistor which is the M-th one of the transistors included in each transistor unit is connected to the signal line 6-M. The impedance part is assumed to have impedance which is sufficiently high compared with that of the signal source 2 and that of the next stage element 3.

When the inverted signals of N phases are applied to the N transistor units, N−1 transistor units, out of the N pairs of transistors, electrically connect impedance parts to the signal lines 6-1 to 6-M. More specifically, each of the dummy paths is switched impedance which switches between an electrical connection and an electrical disconnection between impedance parts and the signal lines 6-1 to 6-M.

The DC bias application circuit 11 determines a DC bias voltage (DC bias) in the signal lines 6-1 to 6-M. The DC bias is a DC voltage for driving the N transistor units included in each of the following units: the filter unit 19 and the dummy unit 20. The DC bias application circuit 11 is a shunt resistor, for example.

Figure 20:
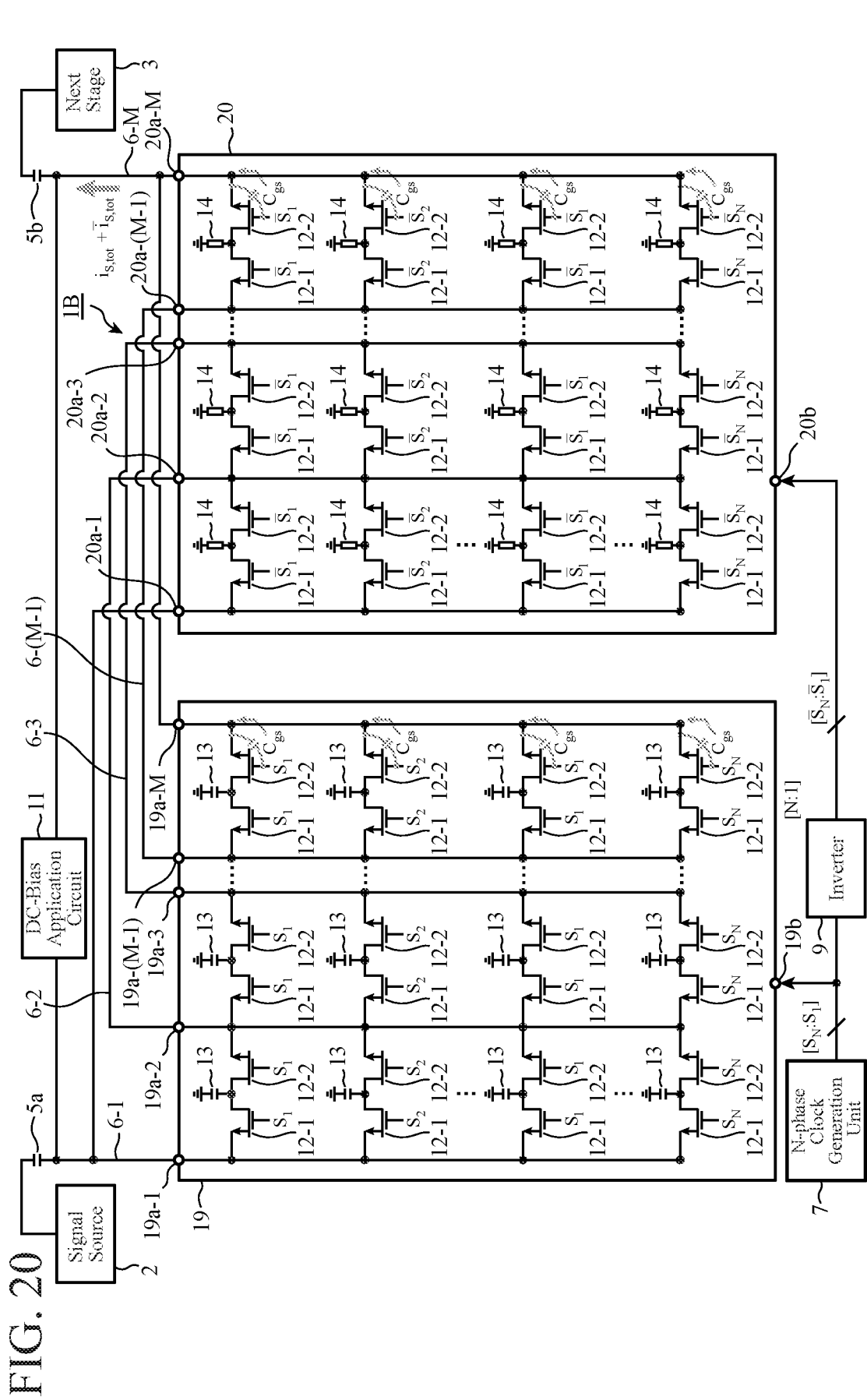
FIG. 20 is a circuit diagram showing a concrete configuration of the filter circuit according to Embodiment 3.

FIG. 20 is a circuit diagram showing a concrete configuration of the filter circuit 1B. In the filter unit 19, each of the paths for the first to N-th phases includes a transistor unit in which M pairs of transistors are connected in cascade, and transistors 12-1 and 12-2 of each pair are connected in series. In each of the transistor units, the source terminal of the transistor 12-1 in the first transistor pair is connected to the signal line 6-1, and the source terminal of the transistor 12-2 is connected to the signal line 6-M. Further, a point of connection between the transistors 12-1 and 12-2 is connected to a grounded capacitor 13. The capacitor 13 has a baseband capacitance which determines the filter characteristics. Further, the capacitance of the capacitor 13 may be variable.

The clock signals $S_1$ to $S_N$ of N phases generated by the N-phase clock generation unit 7 are supplied to the path for a corresponding phase out of the first phase to N-th phase paths in the filter unit 19. The transistors 12-1 and 12-2 in the M pairs of transistors included in the transistor unit in each of the paths, by applying the clock signals to their gate terminals, electrically connect capacitors 13 to the signal lines 6-1 to 6-M. Because of this, the filter unit 19 functions as a bandpass filter in which the frequency of each of the clock signals of N phases is the center frequency of a passband. Further, by changing the frequency of each of the clock signals of N phases, the center frequency of the passband of the filter unit 19 can be changed.

In the dummy unit 20, the dummy paths for N phases which correspond, respectively, to the first phase to N-th phase paths include transistor units each in which M pairs of transistors are connected in cascade and transistors 12-1 and 12-2 of each pair are connected in series. In each of the transistor units, the source terminal of the transistor 12-1 which constitutes the first transistor pair (on one side) is connected to the signal line 6-1, and the source terminal of the transistor 12-2 which constitutes the M-th transistor pair (on another side) is connected to the signal line 6-M. Further, a point of connection between the transistors 12-1 and 12-2 in each of the M pairs of transistors is connected to a grounded impedance part 14. The impedance part 14 is an element which has impedance which is sufficiently high compared with impedance $Z_s$ seen at the signal source 2 and impedance $Z_L$ seen at the next stage element 3.

The inverted signals $S_1$ bar to $S_N$ bar of N phases generated by the inverter 9 are supplied to the dummy path for a corresponding path out of the first phase to N-th phase dummy paths in the dummy unit 20. The transistors 12-1 and 12-2 of the M pairs of transistors included in the transistor unit in each of the dummy paths, by applying the inverted signals to their gate terminals, electrically connect impedance parts 14 to the signal lines 6-1 to 6-M. Because the impedance parts 14 have impedance which is sufficiently high compared with that of the signal source 2 and that of the next stage element 3, the input of the RF signal from the signal source 2 to the dummy unit 20 is reduced. Because of this, the filter circuit 1B can reduce the influence which the dummy unit 20 exerts on the filter characteristics of the filter unit 19.

In the transistors 12-2 of the transistor unit in each of the paths, parasitic capacitances $C_{gs}$ are formed between the gate terminals and the source terminals. The currents $i_{S,1}$ to $i_{S,N}$ of the clock signals $S_1$ to $S_N$ applied to the gate terminals of the transistors 12-2 leak out, via the above-mentioned parasitic capacitances $C_{gs}$, to the signal lines 6-2 to 6-M. When the clock signals $S_1$ to $S_N$ are in an ideal state in which the on-time durations $T_{on}$ is precisely equal in each phase, the sum total of the currents of the clock signals $S_1$ to $S_N$ leaking out to the signal lines 6-2 to 6-M is only a DC component. Because this total current is blocked by the blocking capacitor 5b even though the total current is outputted from the filter unit 19, via the RF signal terminal 19a-M, to the signal line 6-M, the total current is not supplied to the next stage element 3.

In the transistors 12-2 of the transistor units in the dummy unit 20, parasitic capacitances $C_{gs}$ are formed between the gate terminals and the source terminals. The currents $i_{S,1}$ bar to $i_{S,N}$ bar of the inverted signals $S_1$ bar to $S_N$ bar applied to the gate terminals of the transistors 12-2 leak out, via the above-mentioned parasitic capacitances $C_{gs}$, to the signal lines 6-2 to 6-M. Here, when the clock signals $S_1$ to $S_N$ are in an ideal state in which their on-time durations $T_{on}$ are precisely equal, the sum total of the currents of the inverted signals $S_1$ bar to $S_N$ bar is also only a DC component. Because this total current is blocked by the blocking capacitor 5b even though the total current is outputted from the dummy unit 20 to the signal line 6-M, the total current is not supplied to the next stage element 3.

Further, when a time lag occurs in one of the phases of the clock signals $S_1$ to $S_N$ of N phases, a time lag also occurs in a corresponding one of the phases of the inverted signals $S_1$ bar to $S_N$ bar. For example, the on-time duration $T_{on,1}$ of the clock signal $S_1$ of first phase and the off-time duration of the inverted signal $S_1$ bar of first phase are equal. Therefore, when the on-time duration $T_{on,1}$ is longer than the on-time duration of the clock signal of any phase other than the first phase, the off-time duration of the inverted signal $S_1$ bar of first phase is also longer than the off-time duration of the inverted signal of any phase other than the first phase.

In this case, the waveform B1 of the sum total of the currents of the clock signals leaking out from the paths for the phases other than the first phase to the signal line 6-M, and the waveform B2 of the current of the clock signal leaking out from the path for the first phase to the signal line 6-M do not have levels which are inverse to each other. Further, the waveform B3 of the sum total of the currents of the inverted signals leaking out from the dummy paths for the phases other than the first phase to the signal line 6-M, and the waveform B4 of the current of the inverted signal leaking out from the path for the first phase to the signal line 6-M do not have levels which are inverse to each other.

However, the waveforms B1 and B3 have levels which are inverse to each other because the on-time duration and the off-time duration are equal. Further, because the on-time duration of the clock signal $S_1$ of first phase and the off-time duration of the inverted signal $S_1$ bar of first phase are equal, the waveforms B2 and B4 have levels which are inverse to each other. Because of this, the frequency characteristics of the sum of the currents leaking out to the signal line 6-M are only a DC component. Therefore, even though the sum current is outputted to the signal line 6-M, the sum current is blocked by the blocking capacitor 5b and is not supplied to the next stage element 3.

In the filter circuit 1B, even when a clock signal with a phase having a different on-time duration is included in one of the clock signals of N phases, the current pulses of the clock signals and the current pulses of the inverted signals cancel each other out and only a DC component remains, and no spurious current is outputted to the next stage element 3. Because of this, the filter circuit 1B can suppress spurious components even though the filter circuit does not use differential signal lines, and can perform a wideband operation because the filter circuit does not need a balun.

Next, variants of the filter circuit 1B will be explained.

A first variant of the filter circuit 1B includes N transistor units which are included in a dummy unit 20 and which constitute first phase to N-th phase dummy paths, but does not include a DC bias application circuit 11. In the filter circuit 1B, an impedance part 15 shown in FIG. 14 is connected to a point of connection between transistors 12-1 and 12-2 in each of M pairs of transistors in each of the transistor units of the N dummy paths. The impedance part 15 is an element through which a DC component passes, and is an element in which an impedance part 14 and a resistor are connected in parallel, for example.

When inverted signals of N phases are supplied to the transistors of the N transistor units included in the dummy unit 20, N−1 transistor units, out of the N transistor units, electrically connect impedance parts 15 to signal lines 6-1 and 6-M. Each of the resistors which constitute the impedance parts 15 conducts a DC component, so that ground potential is applied, as a DC bias, to the signal lines 6-1 and 6-M. Therefore, a DC bias application circuit 11 can be omitted and the circuit area can be reduced in the first variant of the filter circuit 1B.

A second variant of the filter circuit 1B includes N transistor units which are included in a dummy unit 20 and which constitute first phase to N-th phase dummy paths, but does not include a DC bias application circuit 11. In the filter circuit 1B, an impedance part 16 shown in FIG. 15 is connected to a point of connection between transistors 12-1 and 12-2 in each of M pairs of transistors in each of the transistor units of the N dummy paths. The impedance part 16 is a resistive element having a resistance value which is sufficiently high compared with impedance $Z_s$ seen at a signal source 2 and impedance $Z_L$ seen at a next stage element 3.

By supplying inverted signals of N phases to the transistors of the N transistor units, N−1 transistor units, out of the N transistor units, electrically connect impedance parts 16 which are resistors to signal lines 6-1 to 6-M. Each of the resistors which are the impedance parts 16 conducts a DC component, so that ground potential is applied, as a DC bias, to the signal lines 6-1 to 6-M. Because of this, a DC bias application circuit 11 can be omitted and the circuit area can be reduced in the second variant of the filter circuit 1B.

Although the case in which the transistors are field effect transistors is shown in Embodiments 1 to 3, the transistors may be bipolar junction transistors. In this case, a clock signal or an inverted signal is applied to the base terminal of each transistor, and the emitter terminal is connected to a signal line and the collector terminal is connected to a capacitor or an impedance part, for example. Even though the filter circuits 1, 1A, and 1B are configured in this way, the filter circuits can suppress spurious components and perform a wideband operation.

As mentioned above, in the filter circuit 1B according to Embodiment 3, the clock signals of N phases are applied to the N transistor units included in the filter unit 19, and the inverted signals of N phases are applied to the N transistor units included in the dummy unit 20. Therefore, the clock signals leaking out from the filter unit 19 to the signal line 6-M and the inverted signals leaking out from the dummy unit 20 to the signal line 6-M cancel each other out. Because of this, the filter circuit 1B can suppress spurious components even though the filter circuit does not use differential signal lines, and can perform a wideband operation because the filter circuit does not need a balun.

It is to be understood that a combination of embodiments can be made, a change can be made to an arbitrary component in each of the embodiments, or an arbitrary component in each of the embodiments can be omitted.

INDUSTRIAL APPLICABILITY

The filter circuit according to the present disclosure can be used in wireless communication devices which filter and down-convert an RF signal, for example.

REFERENCE SIGNS LIST 1, 1A, 1B, and 100: Filter circuit, 2: Signal source, 3: Next stage element, 4: Signal line, 5, 5a, and 5b: Blocking capacitor, 6, 6a, 6b, and 6-1 to 6-M: Signal line, 7: N-phase clock generation unit, 8, 17, and 19: Filter unit, 8a, 10a, 17a-1, 17a-2, 18a-1, 18a-2, 19a-1 to 19a-M, and 20a-1 to 20a-M: RF signal terminal, 8b, 17b, and 19b: N-phase clock terminal, 9: Inverter, 10, 18, 20: Dummy unit, 10b, 18b, and 20b: Inverted signal terminal, 11: DC bias application circuit, 12, 12-1, and 12-2: Transistor, 13: Capacitor, and 14 to 16: Impedance part.

The invention claimed is:

1. A filter circuit comprising:
   a filtering circuit which is connected to a signal line having a blocking capacitance for blocking a DC component, and which has multiple transistors and multiple capacitors which constitute paths for multiple phases, and in which the transistors to which clock signals of multiple phases are applied electrically connect the capacitors to the signal line, wherein source terminals of the multiple transistors are electrically connected to the signal line, and drain terminals of the multiple transistors are electrically connected to the respective multiple capacitors; and
   a dummy circuit which is connected to the signal line and which has multiple transistors and multiple impedance parts which constitute multiple dummy paths corresponding, respectively, to the paths for the multiple phases, and in which the transistors to which inverted signals of multiple phases generated by inverting the clock signals are applied electrically connect the impedance parts to the signal line, wherein source terminals of the multiple transistors of the dummy circuit are electrically connected to the signal line, and drain terminals of the multiple transistors of the dummy circuit are electrically connected to the respective impedance parts.

2. The filter circuit according to claim 1, wherein the filtering circuit has, in each of the paths for the multiple phases, a transistor to which the capacitor and the signal line are connected, and the dummy circuit has, in each of the dummy paths for the multiple phases, a transistor to which the impedance part and the signal line are connected.

3. The filter circuit according to claim 1, wherein the filtering circuit has, in each of the paths for the multiple phases, a pair of transistors connected in series, one of the pair of transistors being connected to the signal line, and a point of connection between the pair of transistors being connected to the capacitor, and the dummy circuit has, in each of the dummy paths for the multiple phases, a pair of transistors connected in series, one of the pair of transistors being connected to the signal line, and a point of connection between the pair of transistors being connected to the impedance part.

4. The filter circuit according to claim 1, wherein the filtering circuit has, in each of the paths for the multiple phases, a transistor circuit in which multiple pairs of transistors are connected in cascade, transistors of each transistor pair are connected in series, a transistor on one side of each transistor circuit is connected to the signal line, and a point of connection between transistors of each transistor pair is connected to the capacitor, and the dummy circuit has, in each of the dummy paths for the multiple phases, a transistor circuit in which multiple pairs of transistors are connected in cascade, transistors of each transistor pair are connected in series, a transistor on one side of each transistor circuit is connected to the signal line, and a point of connection between transistors of each transistor pair is connected to the impedance part.

5. The filter circuit according to claim 1, wherein each of the impedance parts is an element which has impedance which is sufficiently high compared with impedance seen at a signal source and impedance seen at a next stage element following the signal source.

6. The filter circuit according to claim 5, wherein each of the impedance parts is an element through which a DC component passes.

7. The filter circuit according to claim 6, wherein the impedance parts are resistors.

\* \* \* \* \*